US010903170B2

(12) United States Patent
Lee et al.

(10) Patent No.: US 10,903,170 B2
(45) Date of Patent: Jan. 26, 2021

(54) SUBSTRATE HAVING EMBEDDED INTERCONNECT STRUCTURE

(71) Applicant: SAMSUNG ELECTRO-MECHANICS CO., LTD., Suwon-si (KR)

(72) Inventors: Doo Hwan Lee, Suwon-Si (KR); Yong Hoon Kim, Suwon-si (KR); Tae Je Cho, Suwon-si (KR); Jin Won Lee, Suwon-Si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 2 days.

(21) Appl. No.: 16/203,053

(22) Filed: Nov. 28, 2018

(65) Prior Publication Data
US 2020/0083179 A1 Mar. 12, 2020

(30) Foreign Application Priority Data

Sep. 7, 2018 (KR) .................. 10-2018-0106862

(51) Int. Cl.
H01L 23/00 (2006.01)
H01L 23/498 (2006.01)
(52) U.S. Cl.
CPC ...... H01L 23/562 (2013.01); H01L 23/49822 (2013.01); H01L 23/49838 (2013.01);
(Continued)
(58) Field of Classification Search
CPC . H01L 23/562; H01L 24/16; H01L 23/49822; H01L 23/49894;
(Continued)

(56) References Cited

U.S. PATENT DOCUMENTS 9,716,067 B2 7/2017 Mahajan et al.
9,754,890 B2 9/2017 Deshpande et al.
(Continued)

FOREIGN PATENT DOCUMENTS

JP H04-018787 A 1/1992
JP 2004-247475 A 9/2004
(Continued)

OTHER PUBLICATIONS

Office Action issued in corresponding Taiwanese Application No. 107143333, dated Jul. 1, 2019.
(Continued)

Primary Examiner — Mouloucoulaye Inoussa
(74) Attorney, Agent, or Firm — Morgan, Lewis & Bockius LLP

(57) ABSTRACT

A substrate having an embedded interconnect structure includes an interconnect structure including a circuit member including circuit layers and a passive device disposed in parallel with the circuit member and including an external electrode, and a printed circuit board including an insulating layer covering the interconnect structure, a first wiring layer disposed on the insulating layer, a first wiring via penetrating through at least a portion of the insulating layer and electrically connecting the first wiring layer to an uppermost circuit layer, among the circuit layers, and a second wiring via penetrating through at least a portion of the insulating layer and electrically connecting the first wiring layer to the external electrode of the passive device. A top surface of the uppermost circuit layer, contacting the first wiring via, is coplanar with a top surface of the external electrode, contacting the second wiring via.

31 Claims, 22 Drawing Sheets

(52) U.S. Cl.
CPC ........ *H01L 23/49894* (2013.01); *H01L 24/16* (2013.01); *H01L 2224/16227* (2013.01); *H01L 2924/19103* (2013.01)

(58) Field of Classification Search
CPC ........... H01L 23/49838; H01L 25/0657; H01L 23/3157; H01L 23/552; H01L 24/02; H01L 25/105; H01L 23/5384; H01L 21/4857; H01L 21/486; H01L 25/50; H01L 23/5389; H01L 23/5386; H01L 21/4853; H01L 23/5383; H01L 23/3114; H01L 21/565
USPC ................. 257/666, 531, E21.502, E27.018; 438/107, 118
See application file for complete search history.

(56) References Cited

U.S. PATENT DOCUMENTS

| | | |
|---|---|---|
| 2004/0178510 A1 | 9/2004 | Sunohara et al. |
| 2005/0062147 A1 | 3/2005 | Wakisaka et al. |
| 2006/0003495 A1 | 1/2006 | Sunohara et al. |
| 2006/0145331 A1 | 7/2006 | Cho et al. |
| 2006/0214288 A1 | 9/2006 | Ohsumi |
| 2008/0273313 A1 | 11/2008 | Wang et al. |
| 2009/0188703 A1 | 7/2009 | Ito et al. |
| 2010/0163290 A1 | 7/2010 | Nagata |
| 2010/0300737 A1 | 12/2010 | Sato et al. |
| 2011/0240354 A1 | 10/2011 | Furuhata et al. |
| 2011/0284269 A1 | 11/2011 | Maeda |
| 2012/0153493 A1* | 6/2012 | Lee .......................... H01L 24/24 257/774 |
| 2014/0118976 A1* | 5/2014 | Yoshikawa ......... H01L 23/5383 361/763 |
| 2014/0182895 A1 | 7/2014 | Lee et al. |
| 2016/0219710 A1 | 7/2016 | Park et al. |
| 2016/0322295 A1* | 11/2016 | Kobayashi .......... H01L 23/5389 |
| 2017/0278766 A1* | 9/2017 | Kim ..................... H01L 23/5389 |
| 2017/0373035 A1 | 12/2017 | Seol et al. |
| 2018/0033719 A1 | 2/2018 | Tsai et al. |
| 2019/0378727 A1 | 12/2019 | Matsuura et al. |

FOREIGN PATENT DOCUMENTS

| | | |
|---|---|---|
| JP | 2005-093942 A | 4/2005 |
| JP | 2006-19441 A | 1/2006 |
| JP | 2010-157709 A | 7/2010 |
| JP | 2014-090080 A | 5/2014 |
| JP | 2007-335764 A | 12/2017 |
| KR | 10-2014-0088000 A | 7/2014 |
| KR | 10-2016-0090626 A | 8/2016 |
| KR | 10-2017-0047688 A | 5/2017 |
| TW | 200840431 A | 10/2008 |
| TW | 200934342 A | 8/2009 |
| TW | 201105189 A1 | 2/2011 |
| TW | 201208504 A1 | 2/2012 |
| TW | 201810575 A | 3/2018 |
| TW | 201828788 A | 8/2018 |

OTHER PUBLICATIONS

Japanese Office Action dated Sep. 10, 2019 issued in Japanese Patent Application No. 2018-228859 (with English translation).
Notice of Office Action issued in Korean 10-2018-0106862 dated Jan. 28, 2020 (with English Translation).
Office Action dated Aug. 27, 2020 in Taiwanese Patent Application No. 108131874 (English translation).

* cited by examiner

SUBSTRATE HAVING EMBEDDED INTERCONNECT STRUCTURE

CROSS-REFERENCE TO RELATED APPLICATION(S)

This application claims benefit of priority to Korean Patent Application No. 10-2018-0106862 filed on Sep. 7, 2018 in the Korean Intellectual Property Office, the disclosure of which is incorporated herein by reference in its entirety.

TECHNICAL FILED

The present disclosure relates to a substrate having an interconnect structure embedded in a printed circuit board, the interconnect structure capable of electrically connecting electronic components disposed on a printed circuit board.

BACKGROUND

Recently, with the development of a high-end set and the employment of a high bandwidth memory (HBM) in relation to an interposer, the market for an interposer for electrical die-to-die connections has grown. Silicon is generally used as a material of an interposer. However, in the case of a silicon interposer, material costs may be high, and the manufacturing process of a through-silicon-via (TSV) is complex, and the manufacturing costs are high.

To resolve the issue, a substrate including a silicon interconnect bridge capable of electrical die-to-die connection has been developed. However, in the case of a silicon interconnect bridge, there may be a reliability issue caused by a discrepancy between coefficients of thermal expansion between a silicon material of the bridge and an organic material of a substrate, and the problem of degradation of power integrity properties.

SUMMARY

An aspect of the present disclosure is to provide a substrate having an embedded interconnect structure including a circuit capable of electrically connecting electronic components mounted on the board, which may resolve a reliability issue, reduce costs, and improve power integrity properties.

Another aspect of the present disclosure is to embed an interconnect structure in which a circuit member including a high-density circuit layer and a passive component are disposed in parallel in a printed circuit board to electrically connect a plurality of electronic components mounted on the printed circuit board.

According to an aspect of the present disclosure, a substrate having an embedded interconnect structure includes an interconnect structure including a circuit member including a plurality of circuit layers and a passive device disposed in parallel with the circuit member and including an external electrode, and a printed circuit board including an insulating layer covering the interconnect structure, a first wiring layer disposed on the insulating layer, a first wiring via penetrating through at least a portion of the insulating layer and electrically connecting the first wiring layer to an uppermost circuit layer, among the plurality of circuit layers, and a second wiring via penetrating through at least a portion of the insulating layer and electrically connecting the first wiring layer to the external electrode of the passive device. A top surface of the uppermost circuit layer, contacting the first wiring via, is coplanar with a top surface of the external electrode, contacting the second wiring via.

According to another aspect of the present disclosure, a substrate having an embedded interconnect structure includes an interconnect structure including a circuit member including a circuit layer and a passive device disposed in parallel with the circuit member and having an external electrode, a printed circuit substrate having the interconnect structure embedded therein, and including a wiring layer electrically connected to the circuit layer and having a density lower than a density of the circuit layer, and a plurality of electronic components mounted on the printed circuit substrate in parallel to each other, and electrically connected to the wiring layer by an electrical connection metal. The plurality of electronic components are electrically connected to each other by the circuit layer.

According to another aspect of the present disclosure, a substrate includes an interconnect structure including circuit layers spaced apart from each other in a thickness direction of the substrate by first insulating layers therebetween, and electrically connected to each other by first connection via layers respectively passing through the first insulating layers; a printed circuit substrate, in which the interconnect structure is embedded, including wiring layers stacked on each other, spaced apart from each other in the thickness direction of the substrate by second insulating layers therebetween, and electrically connected to each other by second connection via layers respectively passing through the second insulating layers; and electronic components disposed on the printed circuit substrate, overlapping portions of the interconnect substrate in the thickness direction, and electrically connected to each other at least through the circuit layers of the interconnection structure. One of the wiring layers extends over the interconnect substrate and is disposed between the electronic components and the interconnect substrate. Vias of a via layer among the second connection via layers connected to the one of the wiring layers disposed between the electronic components and the interconnect substrate, and vias of the first connection via layers of the interconnect substrate are tapered opposite to each other in the thickness direction of the substrate.

According to another aspect of the present disclosure, a substrate includes: an interconnect structure including circuit layers spaced apart from each other in a thickness direction of the substrate by first insulating layers therebetween, and electrically connected to each other by first connection via layers respectively passing through the first insulating layers, a passive component disposed in a cavity of the first insulating layers, and a reinforcing layer covering the passive component and one of the circuit layers and filling at least a portion of the cavity; a printed circuit substrate, in which the interconnect structure is embedded, including wiring layers stacked on each other, spaced apart from each other in the thickness direction of the substrate by second insulating layers therebetween, and electrically connected to each other by second connection via layers respectively passing through the second insulating layers; and electronic components disposed on the printed circuit substrate, overlapping portions of the interconnect substrate in the thickness direction, and electrically connected to each other at least through the circuit layers of the interconnection structure. One of the wiring layers extends over the interconnect substrate and is disposed between the electronic components and the interconnect substrate. The one of the circuit layers covered by a portion of the reinforcing layer is disposed between the portion of the reinforcing layer and the one of the wiring layers disposed between the electronic components and the interconnect substrate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
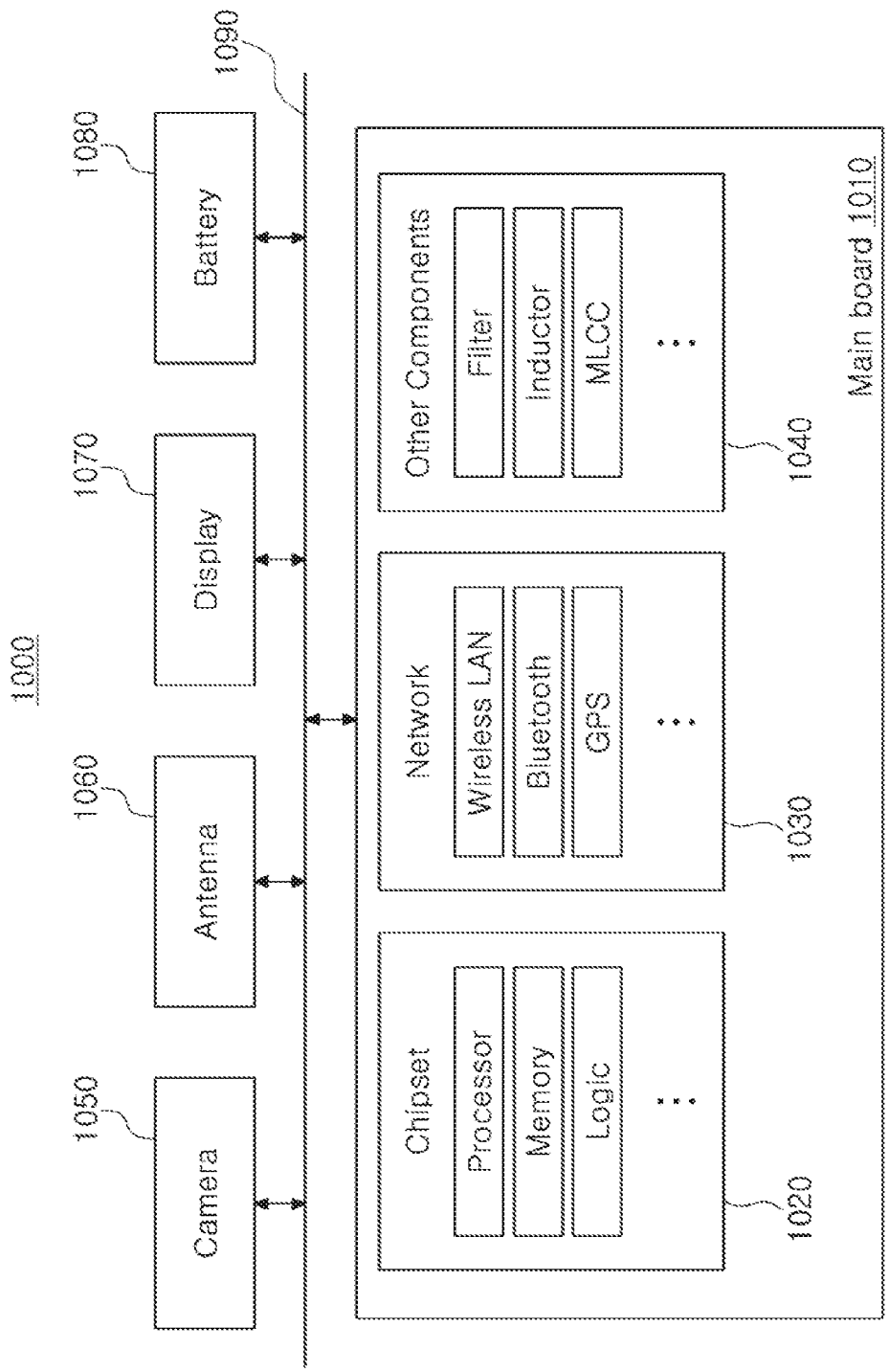
FIG. 1 is a schematic block diagram illustrating an example of an electronic device system.

Hereinafter, embodiments of the present disclosure will be described as follows with reference to the attached drawings. In the drawings, sizes and shapes of elements will be exaggerated or reduced for clear description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
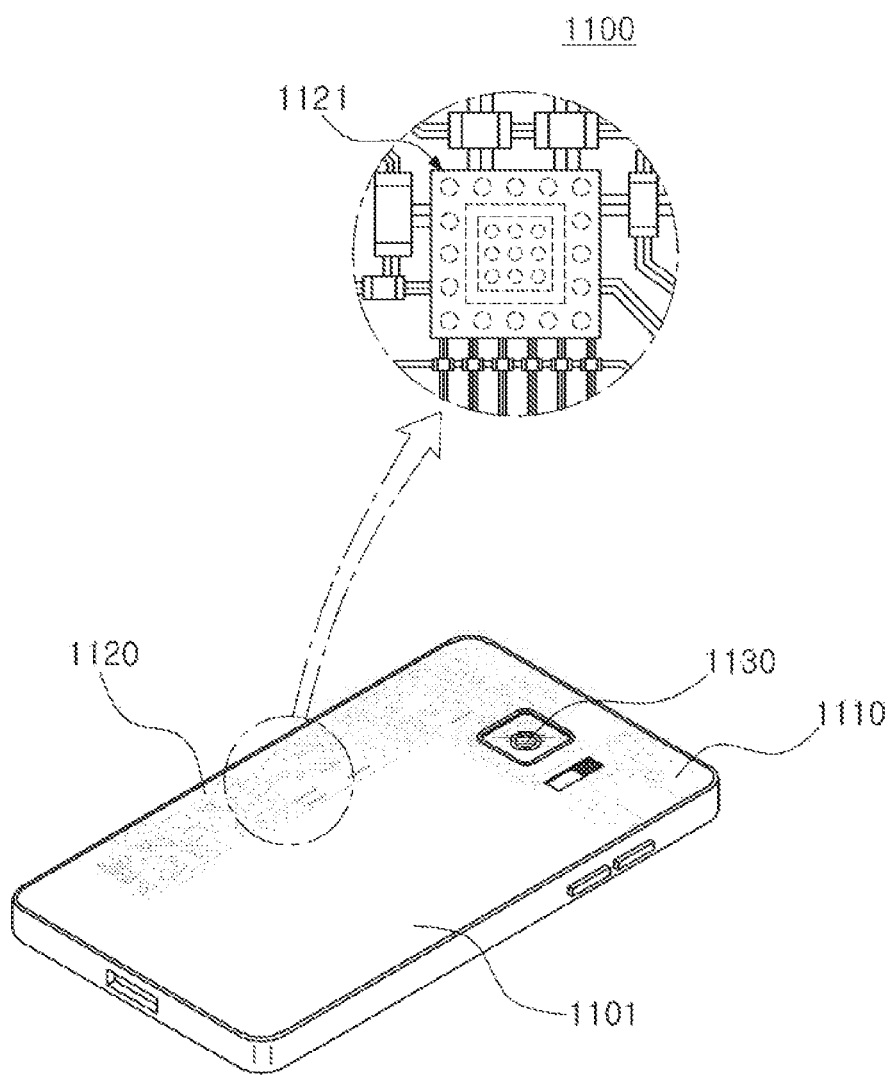
FIG. 2 is a schematic perspective diagram illustrating an example of an electronic device.

FIG. 2 is a schematic perspective diagram illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package Including Organic Interposer

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

Hereinafter, a semiconductor package including an organic interposer manufactured using the aforementioned packaging technology will be described in greater detail with reference to the drawings.

Figure 3:
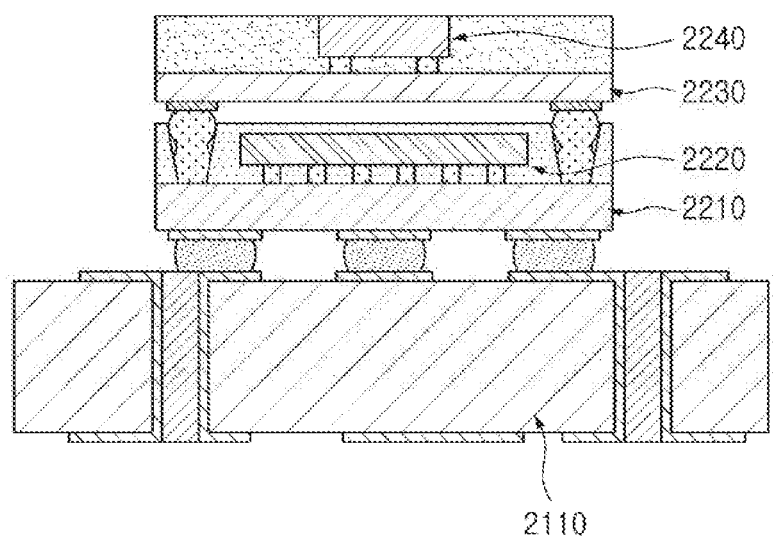
FIG. 3 is a schematic cross-sectional diagram illustrating an example in which a BGA package is mounted on a mainboard of an electronic device.

FIG. 3 is a schematic cross-sectional diagram illustrating an example in which a BGA package is mounted on a mainboard of an electronic device.

Among semiconductor chips, chips provided in an application specific integrated circuit, such as a graphics processing unit (GPU), are significantly expensive, and thus, it may be necessary to perform a packaging in high yield. To this end, a ball grid array (BGA) substrate 2210, capable of redistributing several thousands or several millions of connection pads, may be prepared before mounting a semiconductor ship, and an expensive semiconductor chip, such as a GPU 2220, may be mounted on the BGA substrate 2210 by surface mounting technology (SMT) and packaged, and then mounted on a mainboard 2110.

Meanwhile, in the case of the GPU 2220, it may be necessary to significantly reduce a signal path to a memory, such as a high bandwidth memory (HBM), and to this end, generally, a semiconductor chip, such as an HBM 2220, is mounted on a interposer 2230 and packaged, and the semiconductor is layered in a form of package-on-package on the package on which the GPU 2220 is mounted. However, in this case, a thickness of a device may significantly increase, and there may be a limitation in reducing a signal path.

Figure 4:
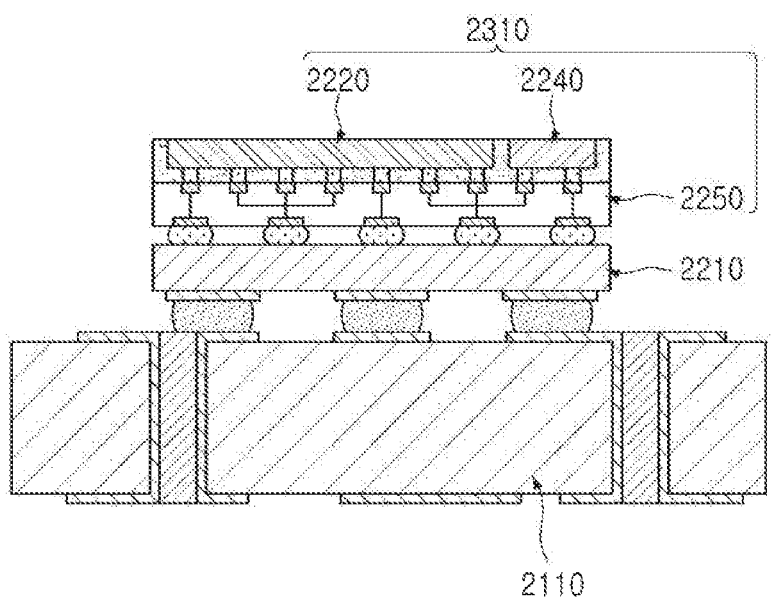
FIG. 4 is a schematic cross-sectional diagram illustrating an example in which a silicon interposer package is mounted on a mainboard.

FIG. 4 is a schematic cross-sectional diagram illustrating an example in which a silicon interposer package is mounted on a mainboard.

To address the aforementioned issue, a semiconductor package 2310 including an organic interposer may be manufactured using an interposer technique of mounting a first semiconductor chip such as a GPU 2220 and a second semiconductor chip such as an HBM 2240 side by side on a surface of a silicon interposer 2250 and packaging the semiconductor chips. In this case, the GPU 2220 and the HBM 2240 having several thousands or several millions of connection pads may be redistributed by the interposer 2250, and further, the GPU 2220 and the HBM. 2240 may be electrically connected to each other by a significantly reduced path. Also, in the case in which the semiconductor package 2310 including an organic interposer is mounted on a BGA substrate 2210, and the like, again and redistributed, the semiconductor package may be mounted on a mainboard 2110. However, in the case of the silicon interposer 2250, it may be difficult to form a through silicon via (TSV), and manufacturing costs of the silicon interposer are also high, and accordingly, it may be difficult to implement a semiconductor package having a large area at low cost.

Figure 5:
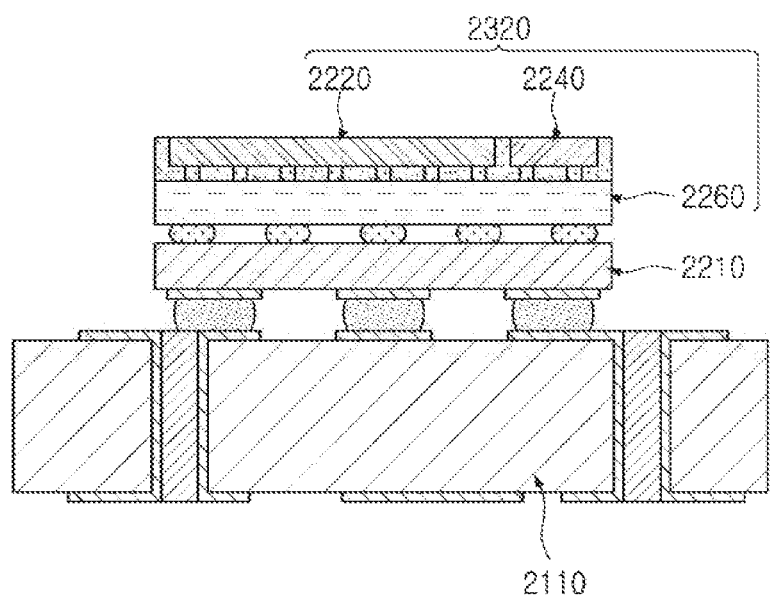
FIG. 5 is a schematic cross-sectional diagram illustrating an example in which an organic interposer package is mounted on a mainboard.

FIG. 5 is a schematic cross-sectional diagram illustrating an example in which an organic interposer package is mounted on a mainboard.

To address the aforementioned issue, an organic interposer 2260 may be used instead of a silicon interposer 2250. For example, a semiconductor package 2310 including an organic interposer may be manufactured using an interposer technique of mounting a first semiconductor chip such as a GPU 2220 and a second semiconductor chip such as an HBM 2240 side by side on a surface of an organic interposer 2260 and packaging the semiconductor chips. In this case, it may be possible to redistribute the GPU 2220 and the HBM 2240 having several thousands or several millions of connection pads by the interposer 2250, and further, the GPU 2220 and the HBM. 2240 may be electrically connected to each other by a significantly reduced path. Also, by remounting the semiconductor package 2310 including an organic interposer on a BGA substrate 2210, and the like, and redistributing the semiconductor package 2310, the semiconductor package may be mounted on a mainboard 2110. Accordingly, it may be possible to implement a large area at low cost.

Meanwhile, in the case of a semiconductor package 2320 including the organic interposer described above, the semiconductor package may be manufactured by performing a packaging process in which the chips 2220 and 2240 are mounted on the interposer 2260 and molded. The reason why the semiconductor package is manufactured as above is that, if the molding process is not performed, it may not be possible to connect the chips to the BGA substrate 2210, and the like, as the chips are not handled, and thus, stiffness may be maintained by the molding process. However, when the molding process is performed, a discrepancy may occur between coefficients of thermal expansion between the interposer 2260 and molding materials of the chips 2220 and 2240, which may cause warpage, deterioration of filling properties of underfill resin, cracks between a die and the molding material, and the like.

Substrate Having an Interconnect Structure

In the descriptions below, a substrate having an embedded interconnect structure including a circuit capable of electrically connecting electronic components mounted on the board to each other, which may resolve a reliability issue, reduce costs, and improve power integrity properties will be described with reference to the drawings.

In the descriptions below, in the case in which the substrate having an interconnect structure is implemented as a BGA substrate, the interposer described above may not be provided.

Figure 6:
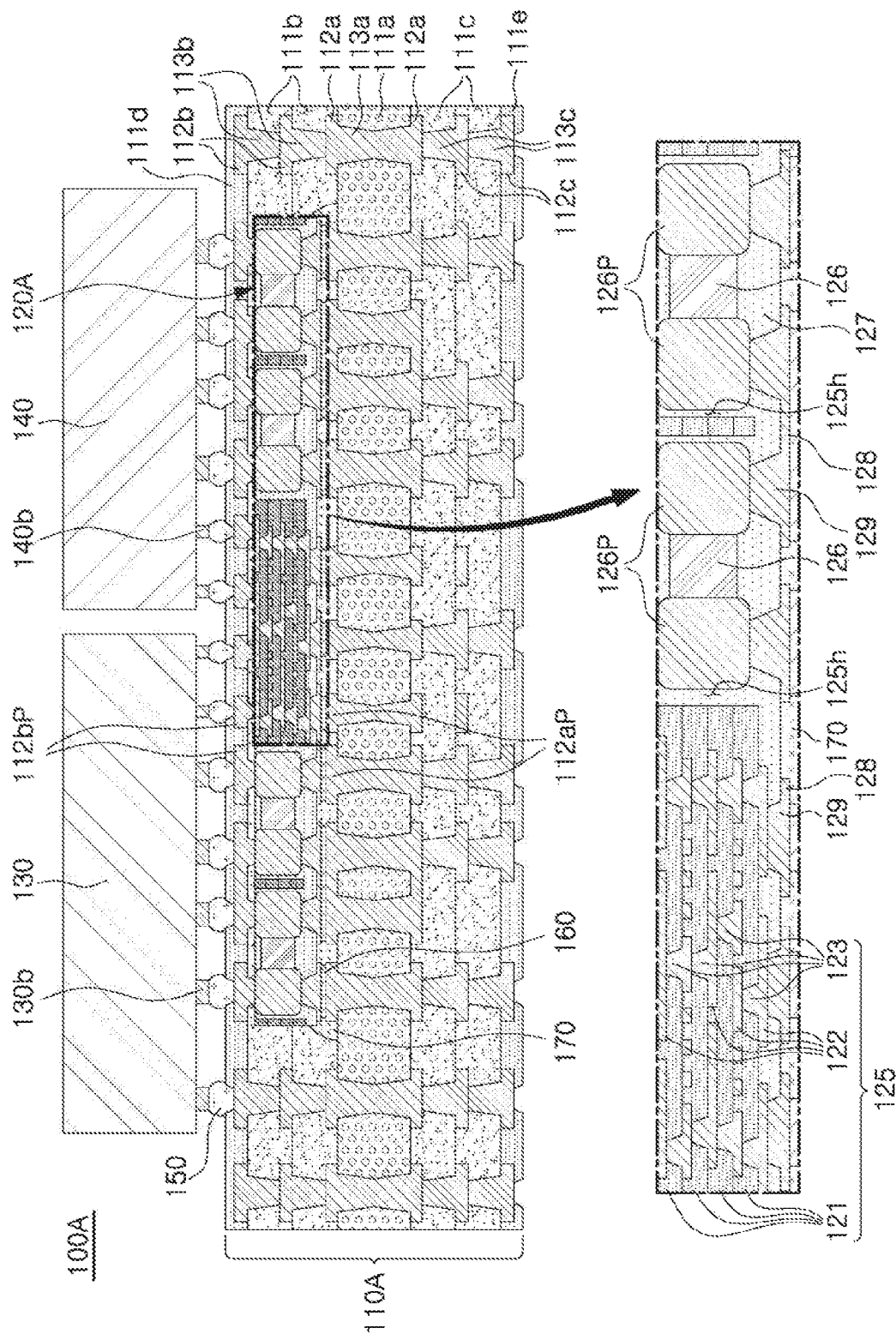
FIG. 6 is a schematic cross-sectional diagram illustrating an example of a substrate having an embedded interconnect structure.

FIG. 6 is a schematic cross-sectional diagram illustrating an example of a substrate having an embedded interconnect structure.

Referring to FIG. 6, a substrate having an interconnect structure 100A may include a printed circuit board 110A, an interconnect structure 120A embedded in the printed circuit board 110A, and first and second electronic components 130 and 140 disposed on the printed circuit board 110A and electrically connected to each other by the interconnect structure 120A. In this case, the interconnect structure 120A may include a circuit member 125 including a plurality of insulating layers 121, a plurality of circuit layers 122, and a plurality of connection via layers 123 and having a cavity 125*h*, a passive device 126 disposed in the cavity 125*h*, and a reinforcing layer 127 covering at least a portion of the circuit member 125 and at least a portion of the passive device 126 and filling at least a portion of the cavity 125*h*.

Meanwhile, with the development of a high-end set and the employment of a high bandwidth memory (HBM) in relation to an interposer, the market for an interposer for electrical die-to-die connection has grown, and silicon is generally used as a material of an interposer. However, in the case of a silicon interposer, a material cost may be high, and the manufacturing process of a through-silicon-via (TSV) is complex, and the manufacturing costs are also high. To resolve the issue, a substrate including a silicon interconnect bridge capable of electrical die-to-die connection has been developed. However, in the case of a silicon interconnect bridge, there is a reliability issue caused by a discrepancy between coefficients of thermal expansion between a silicon material of the bridge and an organic material of a substrate, and as it is difficult to dispose a passive device closely to a power end, power integrity properties may degrade.

The substrate having an interconnect structure 100A according to the exemplary embodiment may have the insulating layer 121 including an organic material as a base in the printed circuit board 110A, and the interconnect structure 120A in which the circuit layer 122 is formed may be embedded in the insulating layer 121. Accordingly, even in the case in which the interconnect structure 120A is embedded in the printed circuit board 110A, the reliability issue cause by a discrepancy between coefficients of thermal expansion may be resolved, unlike a silicon interconnect bridge. Particularly, in the interconnect structure 120A, one or more passive devices 126 may be disposed in parallel with the circuit member 125. For example, in the interconnect structure 120A, the circuit member 125 may have one or more cavities 125*h*, and the passive device 126 may be disposed in each of the cavities 125*h*. The passive device 126 may implemented by various types of passive devices such as a capacitor, an inductor, and the like. As described above, various types of passive devices 126 may be embedded in the interconnect structure 120A, and the passive components may be disposed orthogonally beneath the electronic components 130 and 140, and thus, an electrical connection path may be relatively short. For example, the passive components may be closely connected to power ends of the electronic components 130 and 140. Accordingly, it may be possible to stably improve power integrity properties, and the like.

Further, the reinforcing layer 127 of the interconnect structure 120A may cover the circuit member 125 and the passive device 126. In this case, the reinforcing layer 127 may include a material having an elastic modulus greater than an elastic modulus of the insulating layer 121, and accordingly, the interconnect structure 120A may have stiffness, and warpage may be controlled. For example, the circuit member 120 including an organic material may be sealed to the reinforcing layer 127, rather than being used separately, and accordingly, the circuit member 120 may be maintained without deformation during transferring and layering processes, and even when the circuit member is applied to a large-size package structure, the warpage issue may be resolved.

Meanwhile, the printed circuit board 110A may include an insulating layer 111*b* covering the interconnect structure 120A, a wiring layer 112*b* disposed on the insulating layer 111*b*, and a wiring via layer 113*b* penetrating through at least a portion of the insulating layer 111*b* and electrically connecting the wiring layer 112*b* to an uppermost circuit layer, among the plurality of circuit layers 122 and an external electrode 126P of each of the passive devices 126. In this case, a top surface of the uppermost circuit layer, among the plurality of circuit layers 122, contacting the wiring via layer 113*b* of the printed circuit board 110A, may be coplanar with a top surface of the external electrode 126P of each of the passive devices 126 contacting the wiring via layer 113*b* of the printed circuit board 110A. Thus, insulation distances of the wiring via layer 113*b* contacting the top surfaces may be constant, and undulation may not occur. Accordingly, even though the interconnect structure 120A is embedded, the wiring layer 112*b* and the wiring via layer 113*b* may be easily formed in the upper portions of the interconnect structure 120A in the printed circuit board 110A. In other words, a wiring via connected to the uppermost circuit layer, among the plurality of circuit layers 122 may have a height or a thickness equal to a height or a thickness of a wiring via connected to the external electrode 126P of each of the passive devices 126.

Meanwhile, the printed circuit board 110A may further include a wiring layer 112*b* disposed in a lower portion of the wiring layer 112*b* and having at least a portion covered by the insulating layer 111b. In this case, a wiring via penetrating through at least a portion of the insulating layer 111b among the plurality of wiring via layers 113b and electrically connecting the wiring layers 112b disposed on different layers may have a height different from a height of the wiring via connected to an uppermost circuit layer, among the plurality of circuit layers 122 and a height of the wiring via connected to the external electrode 126P of each of the passive devices 126. For example, a height or a thickness of the wiring via electrically connecting the wiring layers 112b disposed on different layers among the wiring via layers 113b may be greater that a height or a thickness of the wiring via connected to an uppermost circuit layer, among the plurality of circuit layers 122 and a height or a thickness of the wiring via connected to the external electrode 126P of each of the passive devices 126. However, differently from the above configuration, as illustrated in FIGS. 8 and 9, and FIGS. 12 and 13, a height or a thickness of the wiring via electrically connecting the wiring layers 112b disposed on different layers among the wiring via layers 113b may be lower that a height or a thickness of the wiring via connected to an uppermost circuit layer, among the plurality of circuit layers 122 and a height or a thickness of the wiring via connected to the external electrode 126P of each of the passive devices 126. Meanwhile, the wiring via compared to one another in the description above may refer to the wiring vias contacting (or integrated into) the same wiring layer 112b, that is, for example, the wiring vias contacting (or integrated into) the wiring layer 112b in an uppermost portion connected to the electronic components 130 and 140.

In the description below, components of the substrate having an interconnect structure will be described in greater detail with reference to the drawings.

A printed circuit board 110A may be implemented by a general printed circuit board (PCB) including a plurality of wiring layers 112a, 112b and 112c and a plurality of wiring via layers 113a, 113b and 113c. For example, the printed circuit board 110A may include a core insulating layer 111a, a first wiring layer 112a disposed on both surfaces of the core insulating layer 111a, a first wiring via layer 113a penetrating through the core insulating layer 111a and electrically connecting the first wiring layers 112a disposed on the both surfaces, a first build-up insulating layer 111b built up upwardly of the core insulating layer 111a and having one or more layers, a second wiring layer 112b disposed on the first build-up insulating layer 111b and having one or more layers, a second wiring vias layer 113b penetrating through the first build-up insulating layer 111b and having one or more layers, a second build-up insulating layer 111c built up downwardly of the core insulating layer 111a and having one or more layers, a third wiring layer 112c disposed on the second build-up insulating layer 111c and having one or more layers, a third wiring via layer 113c penetrating through the second build-up insulating layer 111c and having one or more layers, a first outermost insulating layer 111d disposed on the first build-up insulating layer 111b, and a second outermost insulating layer 111e disposed on the second build-up insulating layer 111c. The printed circuit board 110A may function as a flip chip ball grid array (FCB) including an organic interposer function, and the like.

Meanwhile, if necessary, the first wiring layer 112a may be referred to as a core wiring layer, the second and third wiring layers 112b and 112c may be referred to as first and second build-up wiring layers, respectively, the first wiring vias layer 113a may be referred to as a core wiring via layer, and the second and third wiring via layers 113b and 113c may be referred to as first and second build-up wiring via layers, respectively. Also, the build-up insulating layer or the outermost insulating layer may be simply referred to as an insulating layer.

The core insulating layer 111a may function as a core layer of the printed circuit board 110A, and may endow stiffness. A material of the core insulating layer 111a may not be particularly limited. For example, an insulating material may be used, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ajinomoto build-up film (ABF), FR-4, bismaleimide triazine (BT), or the like. The core insulating layer 111a may be applied by a copper clad laminate (CCL). The core insulating layer 111a may have an elastic modulus greater than an elastic modulus of the build-up insulating layers 111b and 111c. In other words, the core insulating layer 111a may have excellent stiffness. The core insulating layer 111a may have a thickness greater than a thickness of each of layers of the build-up insulating layers 111b and 111c.

The build-up insulating layers 111b and 111c may be built up on both sides of the core insulating layer 111a with reference to the core insulating layer 111a. A material of the build-up insulating layers 111b and 111c may also not be particularly limited. For example, an insulating material may be used, and the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material, such as an Ajinomoto build-up film (ABF), and the like. The build-up insulating layers 111b and 111c may be built up on both sides of the core insulating layer 111a in the same manner, and may accordingly have the same number of layers. The number of the build-up insulating layers 111b and the number of the build-up insulating layers 111c may not be particularly limited, and may be modified in various manners depending on designs.

The outermost insulating layers 111d and 111e may be disposed on both of outermost portions of the printed circuit board 110A, and may protect internal components of the printed circuit board 110A. On each of the outermost insulating layers 111d and 111e, a plurality of openings allowing a portion of the wiring layers 112b and 112c to be exposed may be formed. A material of the outermost insulating layers 111d and 111e may not be particularly limited. For example, an insulating material may be used, and in this case, a solder resist may be used as the insulating material. However, an insulating material may not be limited thereto, and a prepreg, an Ajinomoto build-up film (ABF), described above, or the like, may be used.

The wiring layers 112a, 112b and 112c may perform a variety of functions in the printed circuit board 110A depending on designs of respective layers. For example, the wiring layers 112a, 112b and 112c may include a ground (GND) pattern, a power (PWR) pattern, a signal (S) pattern, and the like. In this case, the signal (S) pattern may include various signals other than the ground (GND) pattern, the power (PWR) pattern, and the like, such as a data signal, and may also include various types of pads. A material of the wiring layers 112a, 112b and 112c may be a conductive material such as copper (Cu), aluminum (Al), silver (Ag), tin (Sn), gold (Au), nickel (Ni), lead (Pb), titanium (Ti), or alloys thereof, particularly a metal material.

The wiring via layers 113a, 113b and 113c may electrically connect the wiring layers 112a, 112b and 112c disposed on different layers, and an electrical path may be accordingly formed in the printed circuit board 110A. Each of the wiring via layers 113a, 113b and 113c may include a plurality of wiring vias. The wiring via of each of the wiring via layers 113a, 113b and 113c may include copper (Cu), aluminum (Al), silver (Ag), tin (Sn), gold (Au), nickel (Ni), lead (Pb), titanium (Ti), or alloys thereof, particularly a metal material. The wiring via layers 113a, 113b and 113c may perform a variety of functions in the printed circuit board 110A depending on designs of respective layers. For example, the wiring via layers 113a, 113b and 113c may include a ground via, a power via, a signal vias, and the like. The wiring vias of each of the wiring via layers 113a, 113b and 113c may be a filled type via, filled with a conductive material, or may be conformal type vias in which a conductive material is disposed along a wall of the vias. The wiring vias of the first wiring via layer 113a may have an hourglass shape, a cylindrical shape, or the like, and the wiring vias of the second and third wiring via layers 113b and 113c may have tapered shapes formed in opposite directions.

The printed circuit board 110A may include a plurality of first pads 112bP in outermost portions in which the electronic components 130 and 140 are disposed, and at least a portion of the first pad 112bP may be exposed through each of the plurality of openings formed on the first outermost insulating layer 111d. In the exemplary embodiment, the plurality of first pads 112bP may be portions of the second wiring layer 112b. The plurality of first pads 112bP may be electrically connected to the circuit layer 122 of the circuit member 125 and/or the external electrode 126P of each of the passive devices 126 in the interconnect structure 120A through the plurality of wiring vias on the second wiring vias layer 113b. The plurality of first pads 112bP may be electrically connected to the electronic components 130 and 140 by means of a plurality of first electrical connection metals 150. Following the path as described above, the electronic components 130 and 140 may be disposed orthogonally on the interconnect structure 120A, and electrically connected to the circuit layer 122 of the circuit member 125 and/or the external electrode 126P of each of the passive devices in the interconnect structure 120A.

The printed circuit board 110A may include a plurality of second pads 112aP embedded therein. In the exemplary embodiment, the plurality of second pads 112aP may be portions of the first wiring layer 112a. However, in the case in which the interconnect structure 120A is disposed on the first build-up insulating layer 111b, rather than on the core insulating layer 111a, the plurality of second pads 112aP may be portions of the second wiring layer 112b. The plurality of second pads 112aP may be electrically connected to a backside circuit layer 128 in the interconnect structure 120A by means of a second electrical connection metal 160. In other words, the interconnect structure 120A may be electrically connected to an upper portion of the printed circuit board 110A on which the electronic components 130 and 140 are mounted, and also connected to a lower portion of the printed circuit board 110A.

The interconnect structure 120A may be disposed on the core insulating layer 111a of the printed circuit board 110A and embedded by the first build-up insulating layer 111b. To fix the interconnect structure 120A, an underfill resin 170 such as an epoxy resin may be formed on the core insulating layer 111a if necessary. In the exemplary embodiment, the interconnect structure 120A may include a circuit member 125 having one or more cavities 125h, one or more passive devices 126 disposed in each of the cavities 125h, and a reinforcing layer 127 covering at least a portion of the circuit member 125 and at least a portion of the passive device 126 and filling at least a portion of the cavity 125h. Also, the interconnect structure 120A may further include a backside circuit layer 128 disposed on the reinforcing layer 127, and a backside connection via layer 129 penetrating through at least a portion of the reinforcing layer 127 and electrically connecting the backside circuit layer 128 to the circuit layer 122 of the circuit member 125 and the external electrode 126P of the passive devices 126.

The circuit member 125 may electrically connect the electronic components 130 and 140 disposed side by side on the printed circuit board 110A to each other. In other words, the electronic components 130 and 140 may be electrically connected to each other by the circuit layer 122 of the circuit member 125, and the like. The circuit member 125 may include a plurality of the insulating layers 121, a plurality of the circuit layers 122 disposed in the plurality of insulating layers 121, respectively, and a plurality of the connection vias layers 123 penetrating through the plurality of insulating layers, respectively, and electrically connecting the plurality of circuit layers 122 to each other. The cavity 125h may penetrate through at least a portion of each of the plurality of insulating layers 121. For example, the cavity 125h may penetrate through all the plurality of insulating layers 121.

The insulating layer 121 may include an insulating material, and the insulating material may be a photoimageable dielectric (PID). The number of the insulating layers may not be particularly limited, and may be modified in various manners depending on designs. A boundary between the layers of the insulating layers 121 may be distinct, or may be obscure.

The circuit layer 122 may electrically connect the electronic components 130 and 140 to each other. The circuit layer 122 may perform a variety of functions depending on designs of respective layers, and may include at least a signal pattern and a signal pad. A material of the circuit layer 122 may be a conductive material such as copper (Cu), aluminum (Al), silver (Ag), tin (Sn), gold (Au), nickel (Ni), lead (Pb), titanium (Ti), or alloys thereof, particularly a metal material. The number of the circuit layers 122 may not be particularly limited, and may be modified in various manners depending on designs.

The connection vias layer 123 may electrically connect the circuit layers 122 formed on different layers, and an electrical path may be accordingly formed in the circuit member 125. Each of the connection vias layers 123 may include a plurality of connection vias. The connection vias of each of the connection via layers 123 may include a conductive material such as copper (Cu), aluminum (Al), silver (Ag), tin (Sn), gold (Au), nickel (Ni), lead (Pb), titanium (Ti), or alloys thereof, particularly a metal material. The connection vias layer 123 may perform a variety of functions depending on designs of respective layers, and may include at least a signal via. The connection vias of each of the connection vias layers 123 may be a filled type via, filled with a conductive material, or may be a conformal type via in which a conductive material is disposed along a wall of the via. The connection vias of each of the connection vias layers 123 may have tapered shapes formed in opposite directions.

In the case in which a PID is used as a material of the insulating layer 121, a thickness of the insulating layer 121 may be significantly reduced, and a photo via hole may be formed. Accordingly, the circuit layer 122 and the connection via layer 123 may be configured to have high density. For example, the circuit layer 122 and the connection via layer 123 may be configured to have a density higher than densities of the wiring layers 112a, 112b and 112c and the wiring vias layers 113a and 113b of the printed circuit board 110A. Specifically, a thickness of each of the circuit layers 122 may be lower than a thickness of each of the wiring layers 112a, 112b and 112c, and upper/lower gaps of the circuit layers 122 may be narrower than those of the wiring layers 112a, 112b and 112c. Also, the connection vias of each of the connection via layers 123 may have a size smaller than a size of wiring vias of each of the wiring via layers 113a, 113b and 113c, may have a height or a thickness lower than those of the wiring vias of each of the wiring via layers 113a, 113b and 113c, and may have a fine pitch such that a pitch between the connection vias may be narrower than a pitch between the wiring vias. Even in the case in which a different material is used as a material of the insulation layer 121, it may be desirable to design the circuit layer 122 and the connection via layer 123 to have a density higher than a density of the wiring layers 112a, 112b and 112c and the wiring via layers 113a and 113b of the printed circuit substrate 110A. A thickness of each of insulation layer 121 may be smaller than a thickness of each of the insulating layer 111b to allow the density of the circuit layer 122 and the connection via layer 123 to be higher than the density of the wiring layers 112a, 112b and 112c and the wiring via layers 113a and 113b.

The passive device 126 may be provided as one passive device or a plurality of passive devices. Each of the passive devices 126 may be the same or different from one another. Each of the passive devices 126 may be disposed in the cavity 125h of the circuit member 125. If necessary, a plurality of the passive devices 126 may be disposed in a single cavity 125h. The passive device 126 may be a well-known passive device such as a capacitor, an inductor, and the like. Each of the passive devices 126 may have the external electrode 126P. In other words, each of the passive devices 126 may be an independent chip type component. It may be desirable to dispose at least one of the electronic components 130 and 140 orthogonally on at least one of the passive devices 126, and it may also be desirable to dispose at least one of the passive devices 126 orthogonally beneath the electronic component 130 and the electronic component 140. By the arrangement described above, a significantly reduced electrical path may be provided, and power may be stably supplied, and the like.

The reinforcing layer 127 may fill at least a portion of each of the cavities 125h, and may cover at least a portion of the circuit member 125 and at least a portion of the passive device 126. The reinforcing layer 127 may protect the circuit member 125 and the passive device 126, and may endow stiffness to the interconnect structure 120A. In other words, the insulating layer 121 of the circuit member 125 may be formed using a material suitable for a high density design, and stiffness may be enhanced using the reinforcing layer 127. Thus, the reinforcing layer 127 may include a material having an elastic modulus greater than an elastic modulus of the insulating layer 121. As a material of the reinforcing layer 127, a thermosetting resin such as an epoxy resin, a thermoplastic resin such as a polyimide resin, or a material formed by mixing an inorganic filler with the above resins, such as an ABF, and the like, may be used.

The backside circuit layer 128 and the backside connection via layer 129 may allow the interconnect structure 120A to be electrically connected to a lower portion of the printed circuit board 110A. In other words, the backside circuit layer 128 and the backside connection via layer 129 may allow the circuit layer 122 of the circuit member 125 and the external electrode 126P of the passive device 126 in the interconnect structure 120A to be electrically connected to the wiring layers 112a and 112c in a lower portion of the printed circuit board 110A. The backside circuit layer 128 may be electrically connected to the second pad 112aP on the printed circuit board 110A by means of the second electrical connection metal 160. The backside circuit layer 128 and the backside connection via layer 129 may include a conductive material such as copper (Cu), aluminum (Al), silver (Ag), tin (Sn), gold (Au), nickel (Ni), lead (Pb), titanium (Ti), or alloys thereof, particularly a metal material. The backside circuit layer 128 and the backside connection via layer 129 may perform various functions depending on designs. A connection via of the backside connection via layer 129 may be a filled type via, filled with a conductive material, or may be a conformal type via in which a conductive material is disposed along a wall of the via. Also, the connection via of the backside connection via layer 129 may have a tapered shape formed in the same direction as the direction of a connection via of the connection via layer 123. A thickness, a size, a pitch, and the like, of the backside circuit layer 128 and the backside connection via layer 129 may be greater than thicknesses, sizes, pitches, and the like, of the circuit layer 122 and the connection via layer 123. In other words, the backside circuit layer 128 and the backside connection via layer 129 may be formed to have a relatively low density.

Meanwhile, the interconnect structure 120A may be formed using a well-known carrier. For example, the circuit layer 122 may be formed by a plating process on a carrier, the insulating layer 111 may be formed by a PID coating process, a curing process, and the like, a via hole penetrating through the insulating layer 111 may be formed by a photolithography method, the circuit layer 122 and the connection via layer 123 may be formed again by a plating process, and the circuit member 125 may be formed by repeating the above processes. The circuit layer 122 and the connection via layer 123 of the circuit member 125 may be formed in a partial area of the circuit member 125, and only the insulating layer 121 may be layered on the partial area. Meanwhile, an electrical inspection to check whether a circuit operates properly may be performed using an exposed circuit layer 122. In other words, the circuit layer 122 may include a circuit pattern for an electrical inspection. Thereafter, one or more cavities 125h may be formed in an area in which neither of the circuit layer 122 or the connection via layer 123 of the circuit member 125 is formed by a photolithography method, using laser drilling, or the like, and the passive device 126 may be disposed in each of the cavities 125h. Then, at least a portion of the circuit member 125 and at least a portion of the passive device 126 may be covered by the reinforcing layer 127, and at least a portion of the cavity 125h may be filled by the reinforcing layer 127. The reinforcing layer 127 may be formed by laminating and curing an ABF, and the like. Additionally, a via hole for the backside connection via layer 129 penetrating through at least a portion of the reinforcing layer 127 may be formed using laser drilling and/or mechanical drilling, or others, and the backside connection via layer 129 and the backside circuit layer 128 may be formed by a plating process. The interconnect structure 12 OA may be formed by a series of processes as described above.

The electrical components 130 and 140 may be semiconductor chips. In this case, each of the semiconductor chips may include an integrated circuit (IC) in which several hundreds to several millions of devices are integrated in a single chip. The integrated circuit may be, for example, a processor chip, such as a central processing unit (CPU) or a graphics processor (for example, a graphics processing unit (GPU)), a field programmable gate array (FPGA), a digital signal processor, a cryptographic processor, a microprocessor, a microcontroller, and the like, more particularly, an application processor (AP). However, the semiconductor is not limited thereto, and may be a memory chip such as a volatile memory (for example, a dynamic random access memory (DRAM)), a non-volatile memory (for example, a read only memory (ROM)), a flash memory, a high bandwidth memory (HBM), and the like, a logic chip such as an application-specific integrated circuit (ASIC), and the like, or a chip such as a power management IC (PMIC). As an example, the first electronic component 130 may include a processor chip such as an AP, and the second electronic component 140 may include a memory chip such as an HBM, but the electronic components 130 and 140 are not limited thereto.

Each of the electronic components 130 and 140 may be formed based on an active wafer, and in this case, a basic material forming a body of each of the electronic components may be silicon (Si), germanium (Ge), gallium arsenide (GaAs), and the like. In the body, various circuits may be formed. Also, a connection pad for electrically connecting the electronic components 130 and 140 to other components may be formed in the body, and the connection pad may include a conductive material such as aluminum (Al), copper (Cu), and the like. The electronic components 130 and 140 may be a bare die, and in this case, bumps 130b and 140b may be disposed on the connection pad, and the electronic components 130 and 140 may be mounted on the printed circuit board 110A by means of the first electrical connection metal 150. In other words, the electronic components 130 and 140 may be electrically connected to the second wiring layer 112b disposed on the interconnect structure 120A of the printed circuit board 110A by means of the first electrical connection metal 150, and may be electrically connected to the interconnect structure 120A by the second wiring via layer 113b on the interconnect structure 120A. Each of the electronic components 130 and 140 may be a packaged die, and in this case, an additional insulating layer and an additional redistribution layer may be formed on the connection pad, and the bumps 130b and 140b may be connected to the redistribution layer.

The first electrical connection metal 150 may be formed of a metal having a low melting point, such as a solder composed of tin (Sn), aluminum (Al), copper (Cu), and the like, but a material of the first electrical connection metal 150 is not limited thereto. The first electrical connection metal 150 may be a land, a ball, a pin, or the like. The first electrical connection metal 150 may be configured to have multiple layers or a single layer. In the case in which the first electrical connection metal 150 is configured to have multiple layers, the first electrical connection metal 150 may include a copper pillar and a solder, and in the case in which the first electrical connection metal 150 is configured to have a single layer, the first electrical connection metal 150 may include a tin-silver solder. However, a material of the first electrical connection metal 150 is not limited thereto.

The second electrical connection metal 160 may be formed of a paste including a metal having a low melting point, such as a paste including a solder composed of tin (Sn), aluminum (Al), copper (Cu), and the like. However, a material of the second electrical connection metal 160 is not limited thereto. As a material of the second electrical connection metal 160, another well-known conductive paste may be used.

Figure 7:
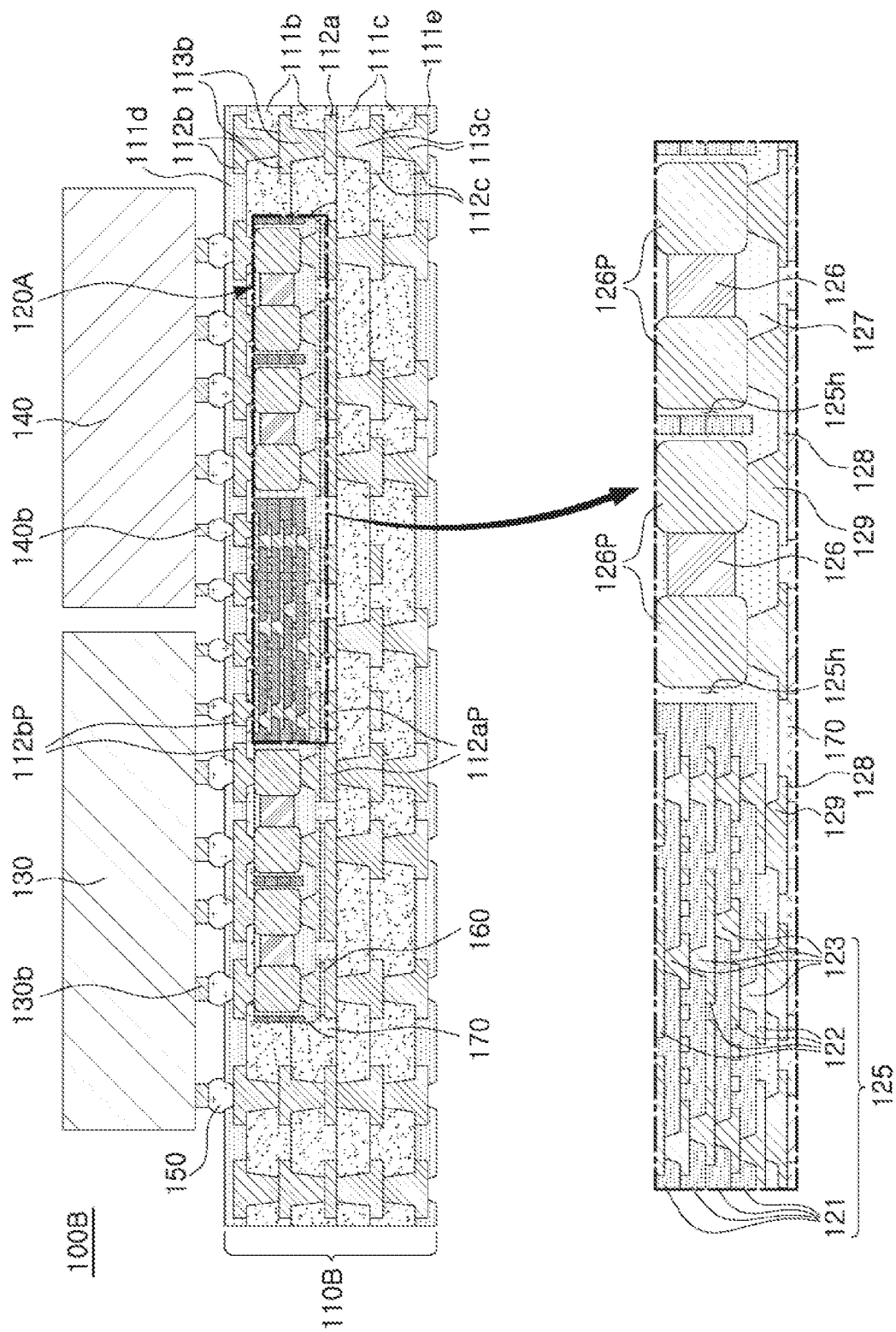
FIG. 7 is a schematic cross-sectional diagram illustrating another example of a substrate having an embedded interconnect structure.

FIG. 7 is a schematic cross-sectional diagram illustrating another example of a substrate having an embedded interconnect structure.

Referring to the diagram, in a substrate having an embedded interconnect structure 100B according to another exemplary embodiment, a printed circuit board 110B may be disposed instead of the printed circuit board 110A, and the printed circuit board 110B may not include a core insulating layer 111a and a first wiring via layer 113a, and the number first wiring layers 112a may be reduced, as compared to the substrate having an embedded interconnect structure 100A described above. In other words, the printed circuit board 110B may be a coreless substrate manufactured by a coreless process. Meanwhile, the diagram illustrates a coreless structure in which a second build-up insulating layer 111c is built up in a lower portion of a first build-up insulating layer 111b, but an exemplary embodiment is not limited thereto. The coreless structure may be modified to a coreless structure in which only a plurality of the first build-up insulating layers 111b are layered. In this case, only the second wiring via layer 113b may be present, and thus, overall taper directions of the wiring vias may be the same. Alternately, the number of the first build-up insulating layer 111b and the number of the second build-up insulating layer 111c may be configured to be different from each other. For example, the second build-up insulating layer 111c may be configured to have one layer, and the remaining layers may be configured to be the first build-up insulating layers 111b, providing a greater number of the first build-up insulating layers 111b than the second build-up insulating layer 111c. In this case, only a taper direction of the wiring via in a lowermost portion may be opposite. The descriptions of the other components and configurations will not be repeated as the descriptions are the same as the descriptions described with reference to FIG. 6 and other diagrams.

Figure 8:
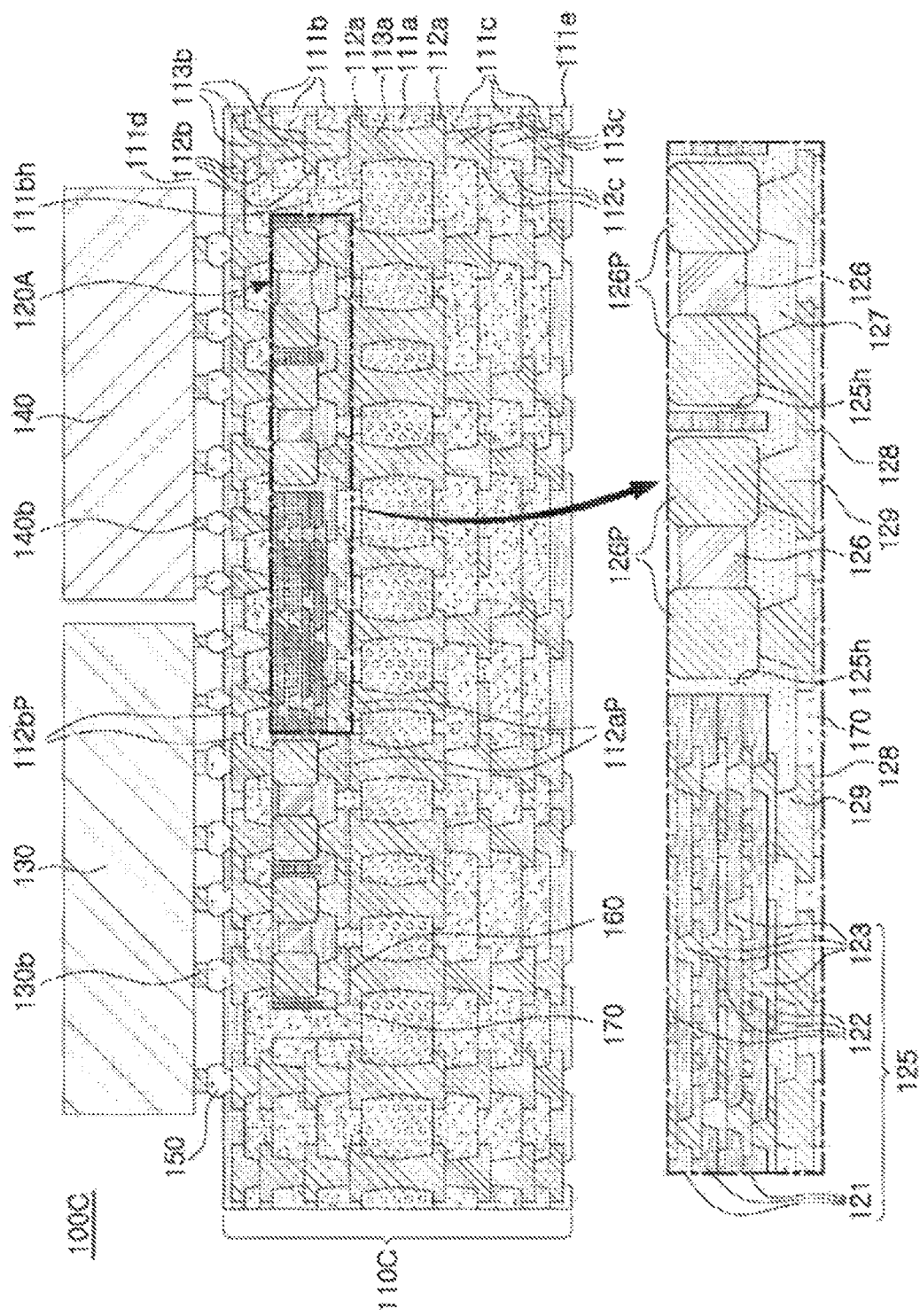
FIG. 8 is a schematic cross-sectional diagram illustrating another example of a substrate having an embedded interconnect structure.

FIG. 8 is a schematic cross-sectional diagram illustrating another example of a substrate having an embedded interconnect structure Referring to the diagram, in an substrate having an embedded interconnect structure 100C according to another example embodiment, a printed circuit board 110C may be disposed instead of the printed circuit board 110A, and a cavity 111bh may be formed on a first build-up insulating layer 111b on the printed circuit board 110C, and an interconnect structure 120A may be disposed in the cavity 111bh, as compared to the substrate having an embedded interconnect structure 100A described above. The configuration above may be implemented by layering one or more first build-up insulating layers 111b on which the cavity 111bh is formed, disposing the interconnect structure 120A in the cavity 111bh, and additionally layering one or more first build-up insulating layers 111b. Alternately, the configuration above may be implemented by layering one or more first build-up insulating layers 111b, processing the cavity 111bh, disposing the interconnect structure 120A in the cavity 111bh, and additionally layering one or more first build-up insulating layers 111b. The additionally layered one or more first build-up insulating layers 111b that fills the cavity 111bh after disposing the interconnect structure 120A may cover side surfaces of the interconnect structure 120A, such that the other first build-up insulating layers 111b formed before the additionally layered one or more first build-up insulating layers 111b may be spaced apart from the side surfaces of the interconnect structure 120A by the additionally layered one or more first build-up insulating layers 111b. In this case, the additionally layered one or more first build-up insulating layers 111b that fills the cavity 111bh may be in contact with the underfill resin 170. The descriptions of the other components and configurations will not be repeated as the descriptions are the same as the descriptions described with reference to FIGS. 6 and 7 and other diagrams.

Figure 9:
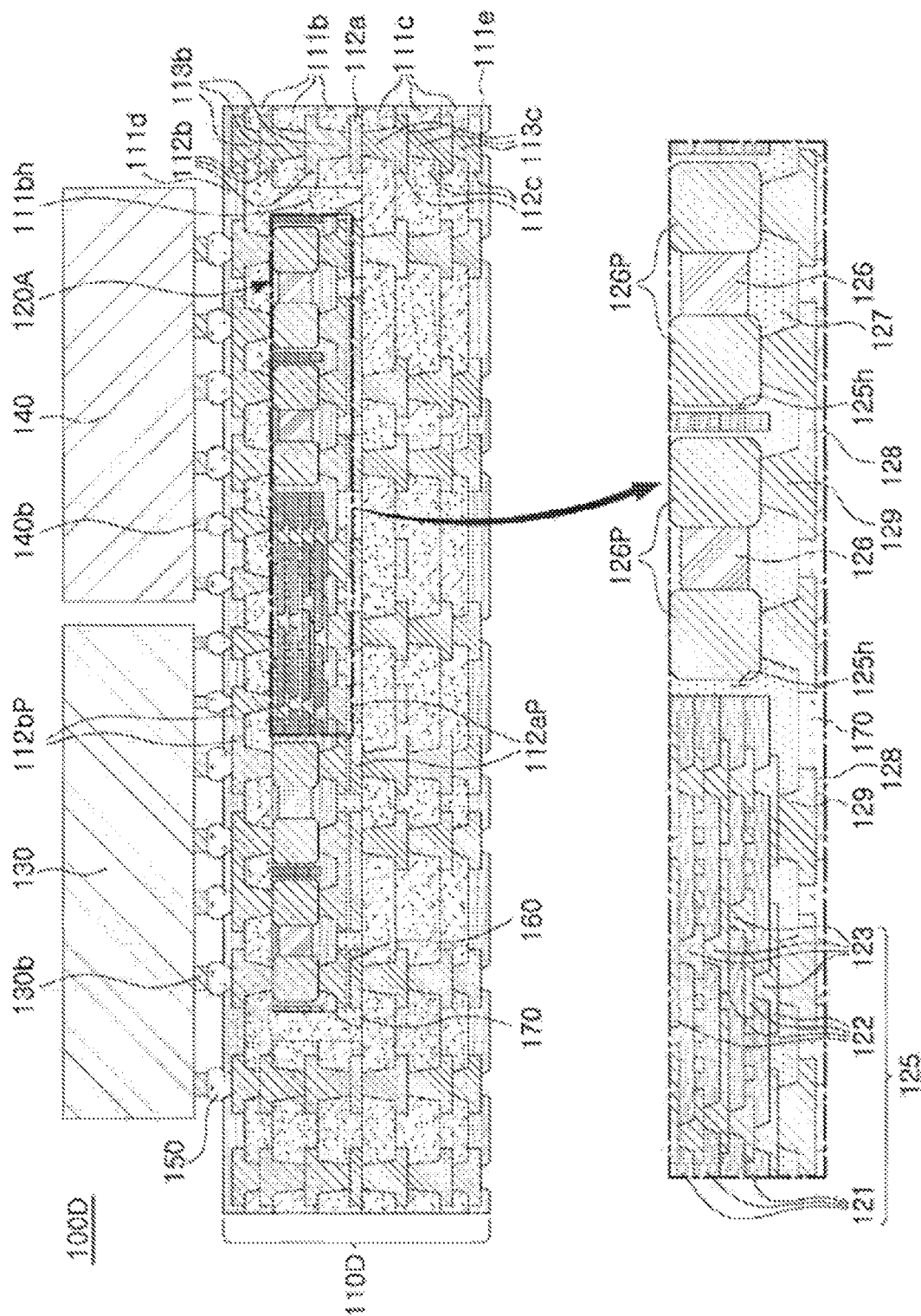
FIG. 9 is a schematic cross-sectional diagram illustrating another example of a substrate having an embedded interconnect structure.

FIG. 9 is a schematic cross-sectional diagram illustrating another example of a substrate having an embedded interconnect structure.

Referring to the diagram, in an substrate having an embedded interconnect structure 100D according to another example embodiment, a printed circuit board 110D may be disposed instead of the printed circuit board 110C, and the printed circuit board 110D may not include a core insulating layer 111a and a first wiring via layer 113a, and the number first wiring layers 112a may be reduced, as compared to the substrate having an embedded interconnect structure 100C described above. In other words, the printed circuit board 110D may be a coreless substrate manufactured by a coreless process. The descriptions of the other components and configurations will not be repeated as the descriptions are the same as the descriptions described with reference to FIGS. 6 to 8 and other diagrams.

Figure 10:
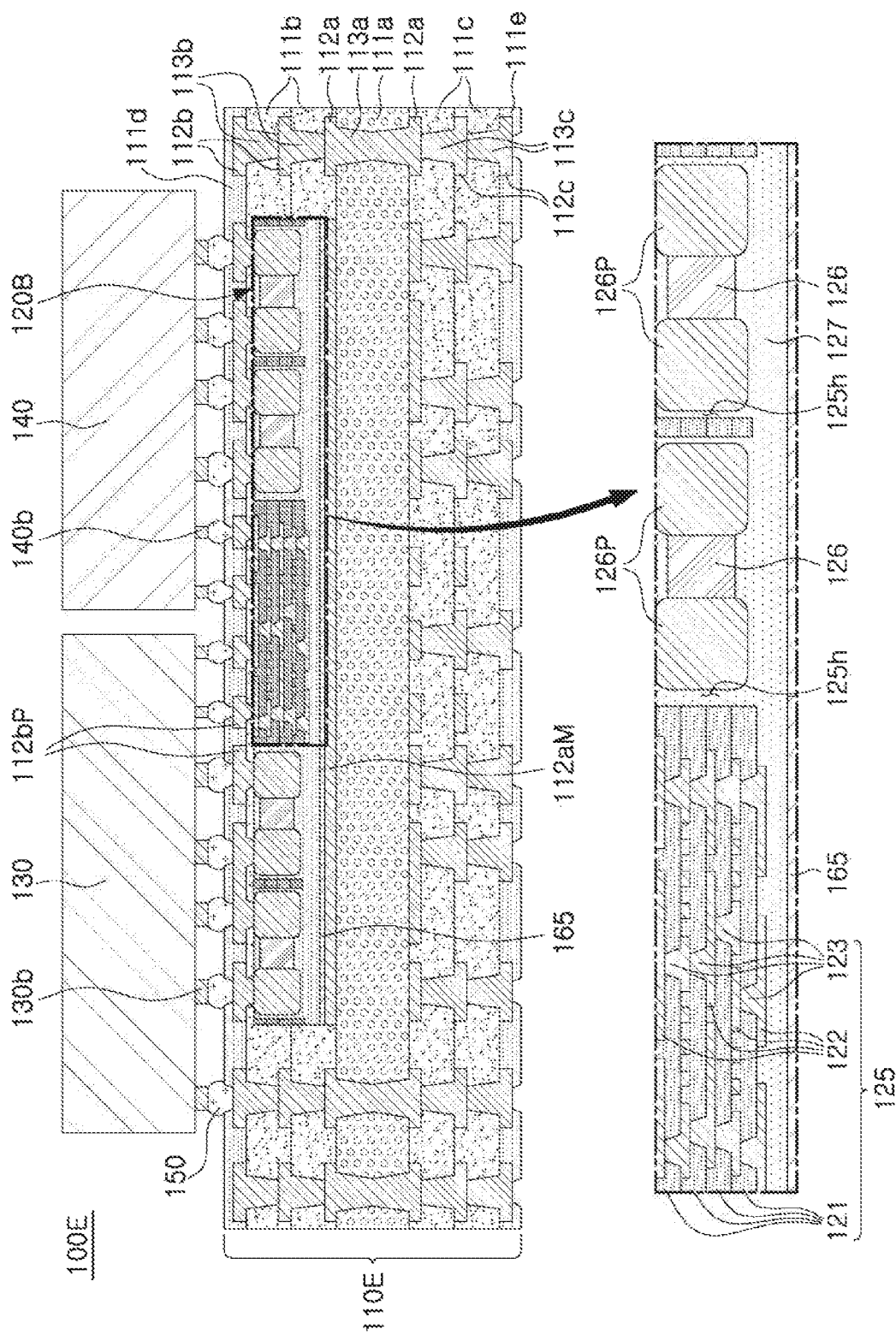
FIG. 10 is a schematic cross-sectional diagram illustrating another example of a substrate having an embedded interconnect structure.

FIG. 10 is a schematic cross-sectional diagram illustrating another example of a substrate having an embedded interconnect structure.

Referring to the diagram, in an substrate having an embedded interconnect structure 100E according to another example embodiment, a printed circuit board 110E may be disposed instead of the printed circuit board 110A, and in the printed circuit board 110E, an interconnect structure 120B in which a backside circuit layer 128 and a backside connection via layer 129 are not provided may be embedded, as compared to the substrate having an embedded interconnect structure 100A described above. The printed circuit board 110E may include a metal layer 112aM embedded therein, and the metal layer 112aM may be disposed on a core insulating layer 111a, but an exemplary embodiment is not limited thereto. The metal layer 112aM may be disposed in one of a first build-up insulating layer 111b. The interconnect structure 120B may be disposed on the metal layer 112aM and embedded in the printed circuit board 110E. For example, the interconnect structure 120B may be attached to the metal layer 112aM by means of an adhesive 165 such that a bottom surface of a reinforcing layer 127, opposing electronic components 130 and 140, is attached to the metal layer 112aM. The metal layer 112aM may include a conductive material such as copper (Cu), aluminum (Al), silver (Ag), tin (Sn), gold (Au), nickel (Ni), lead (Pb), titanium (Ti), or alloys thereof, particularly a metal material. The adhesive 165 may be a well-known conductive paste, a solder paste, or the like. In this case, the above described underfill resin 170 may be omitted. The descriptions of the other components and configurations will not be repeated as the descriptions are the same as the descriptions described with reference to FIGS. 6 to 9 and other diagrams.

Figure 11:
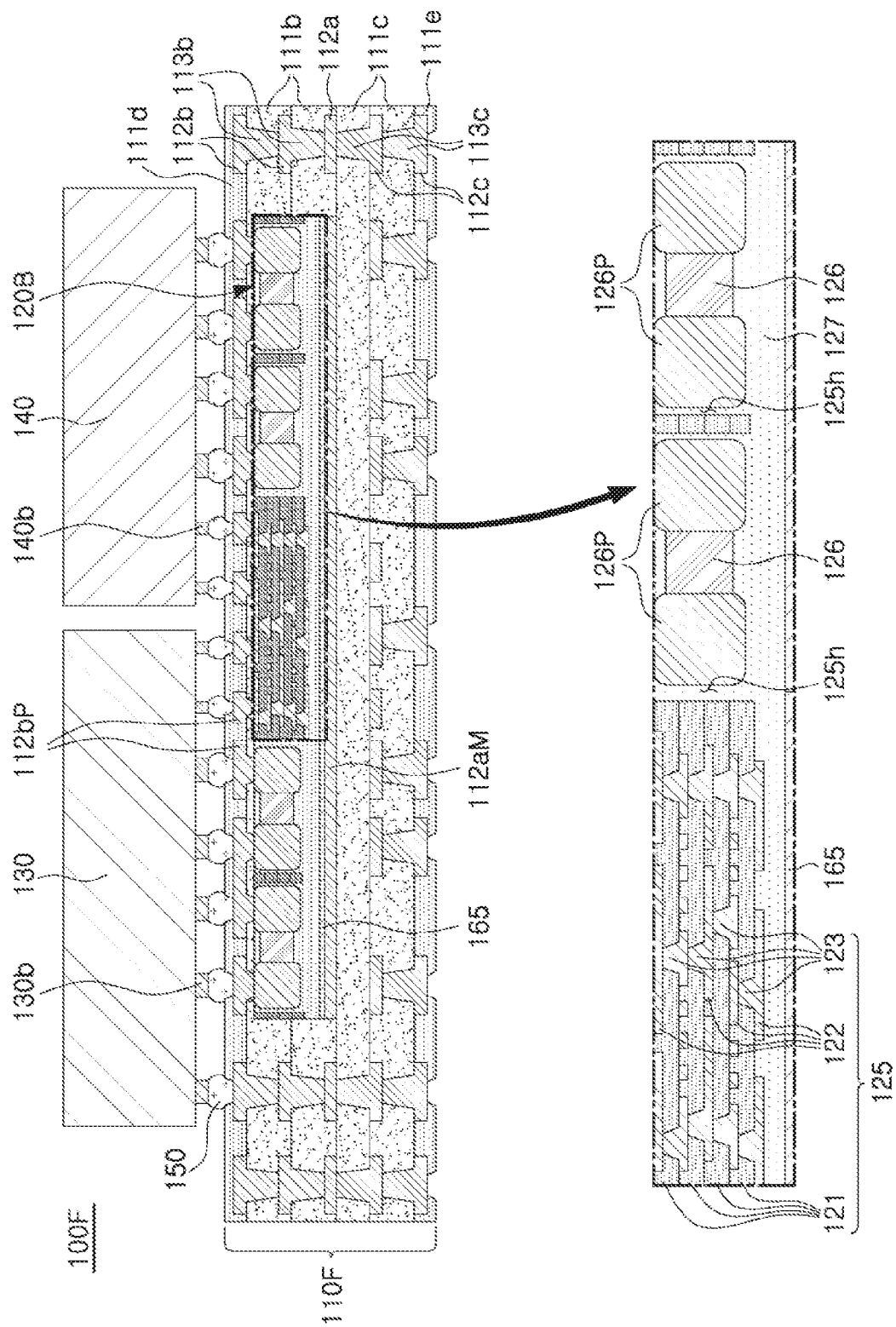
FIG. 11 is a schematic cross-sectional diagram illustrating another example of a substrate having an embedded interconnect structure.

FIG. 11 is a schematic cross-sectional diagram illustrating another example of a substrate having an embedded interconnect structure.

Referring to the diagram, in an substrate having an embedded interconnect structure 100F according to another example embodiment, a printed circuit board 110F may be disposed instead of the printed circuit board 110E, and the printed circuit board 110F may not include a core insulating layer 111a and a first wiring via layer 113a, and the number first wiring layers 112a may be reduced, as compared to the substrate having an embedded interconnect structure 100E described above. In other words, the printed circuit board 110F may be a coreless substrate manufactured by a coreless process. The descriptions of the other components and configurations will not be repeated as the descriptions are the same as the descriptions described with reference to FIGS. 6 to 10 and other diagrams.

Figure 12:
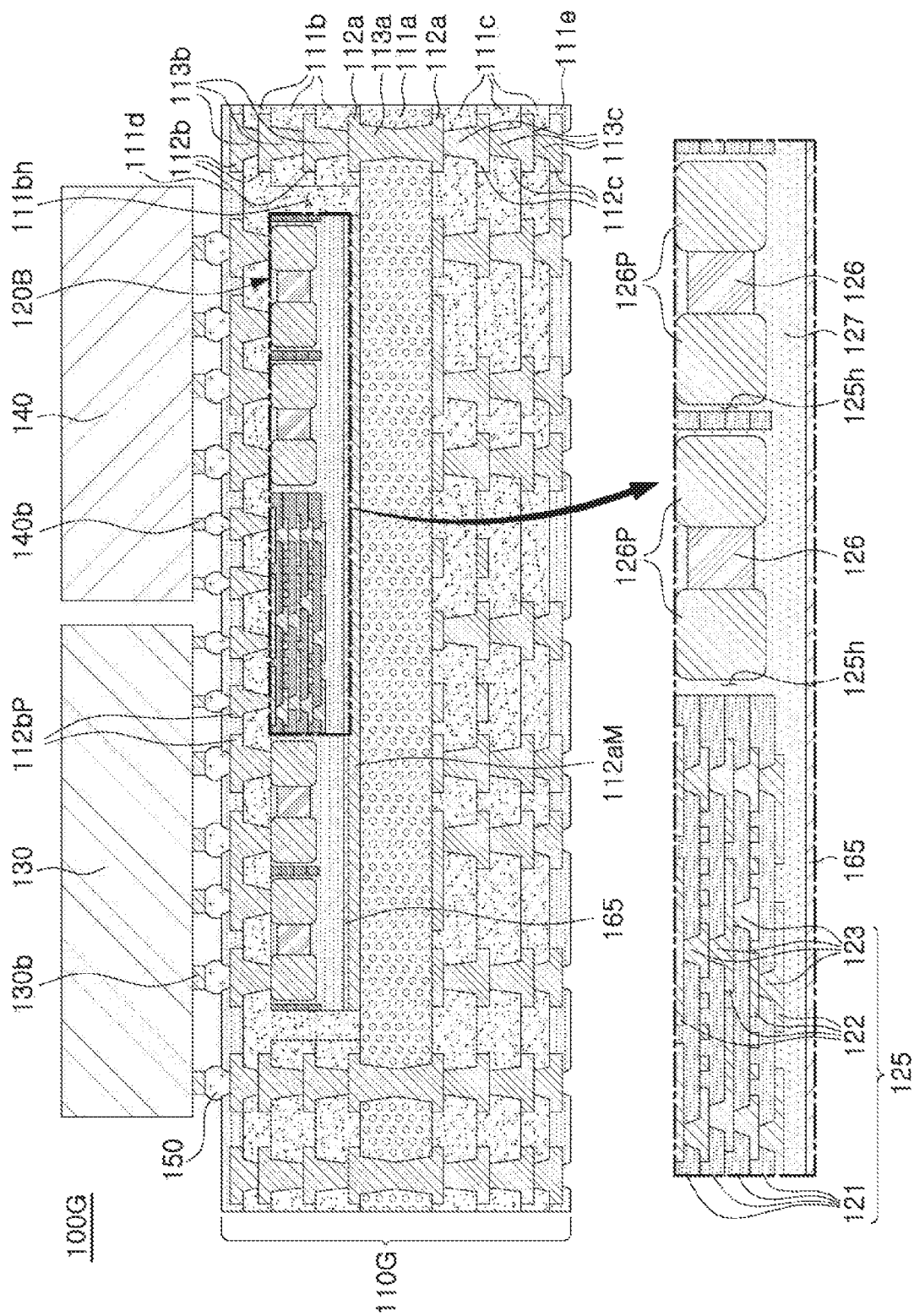
FIG. 12 is a schematic cross-sectional diagram illustrating another example of a substrate having an embedded interconnect structure.

FIG. 12 is a schematic cross-sectional diagram illustrating another example of a substrate having an embedded interconnect structure.

Referring to the diagram, in an substrate having an embedded interconnect structure 100G according to another example embodiment, a printed circuit board 110G may be disposed instead of the printed circuit board 110E, and a cavity 111bh may be formed on a first build-up insulating layer 111b on the printed circuit board 110G, and an interconnect structure 120B may be disposed on the cavity 111bh, as compared to the substrate having an embedded interconnect structure 100E described above. The configuration above may be implemented by layering one or more first build-up insulating layers 111b on which the cavity 111bh is formed, disposing the interconnect structure 120B on the cavity 111bh, and additionally layering one or more first build-up insulating layers 111b. Alternately, the configuration above may be implemented by layering one or more first build-up insulating layers 111b, processing the cavity 111bh, disposing the interconnect structure 120B on the cavity 111bh, and additionally layering one or more first build-up insulating layers 111b. The descriptions of the other components and configurations will not be repeated as the descriptions are the same as the descriptions described with reference to FIGS. 6 and 11 and other diagrams.

Figure 13:
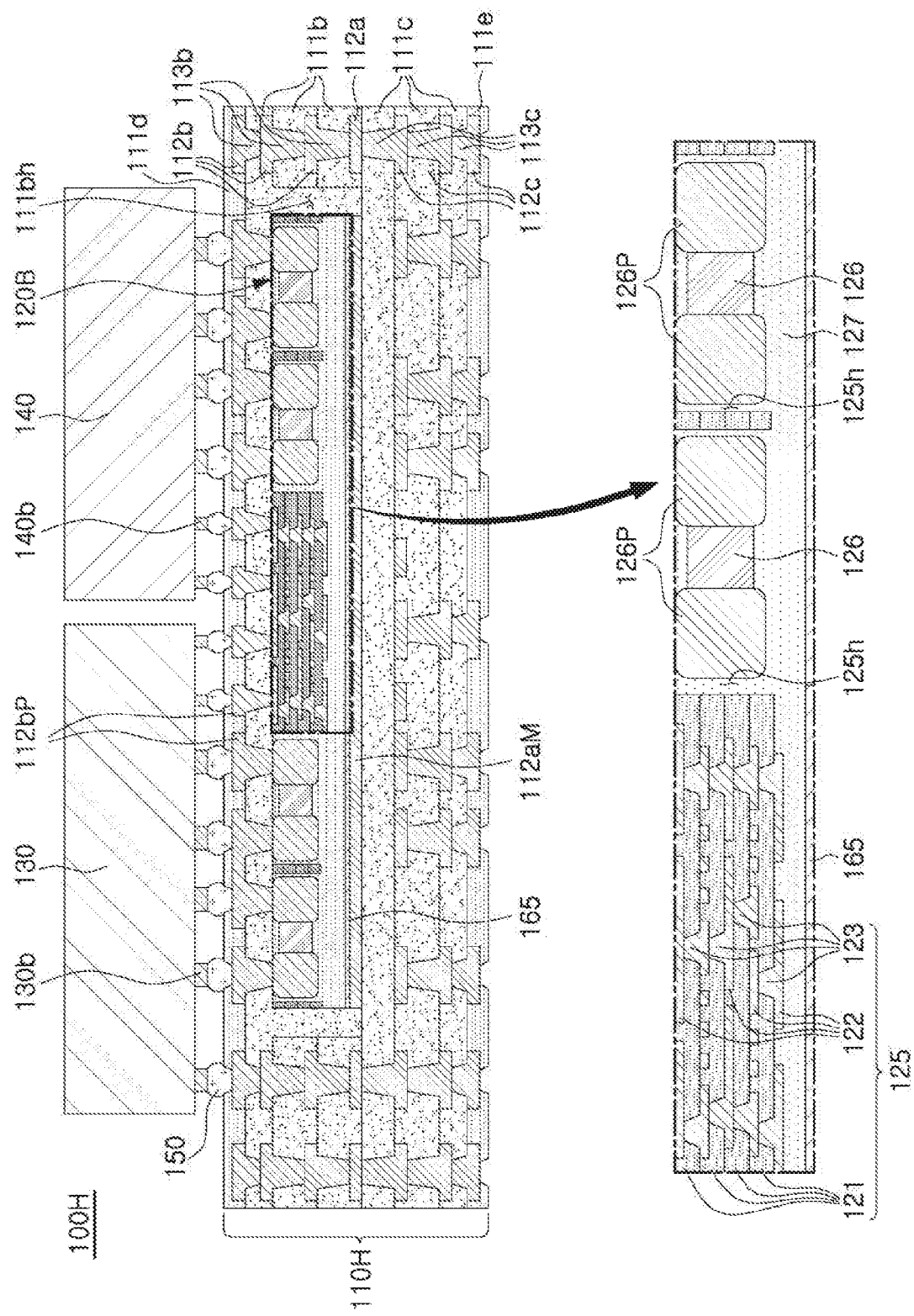
FIG. 13 is a schematic cross-sectional diagram illustrating another example of a substrate having an embedded interconnect structure.

FIG. 13 is a schematic cross-sectional diagram illustrating another example of a substrate having an embedded interconnect structure.

Referring to the diagram, in an substrate having an embedded interconnect structure 100H according to another example embodiment, a printed circuit board 110H may be disposed instead of the printed circuit board 110G, and the printed circuit board 110H may not include a core insulating layer 111a and a first wiring via layer 113a, and the number first wiring layers 112a may be reduced, as compared to the substrate having an embedded interconnect structure 100G described above. In other words, the printed circuit board 110H may be a coreless substrate manufactured by a coreless process. The descriptions of the other components and configurations will not be repeated as the descriptions are the same as the descriptions described with reference to FIGS. 6 to 12 and other diagrams.

Figure 14:
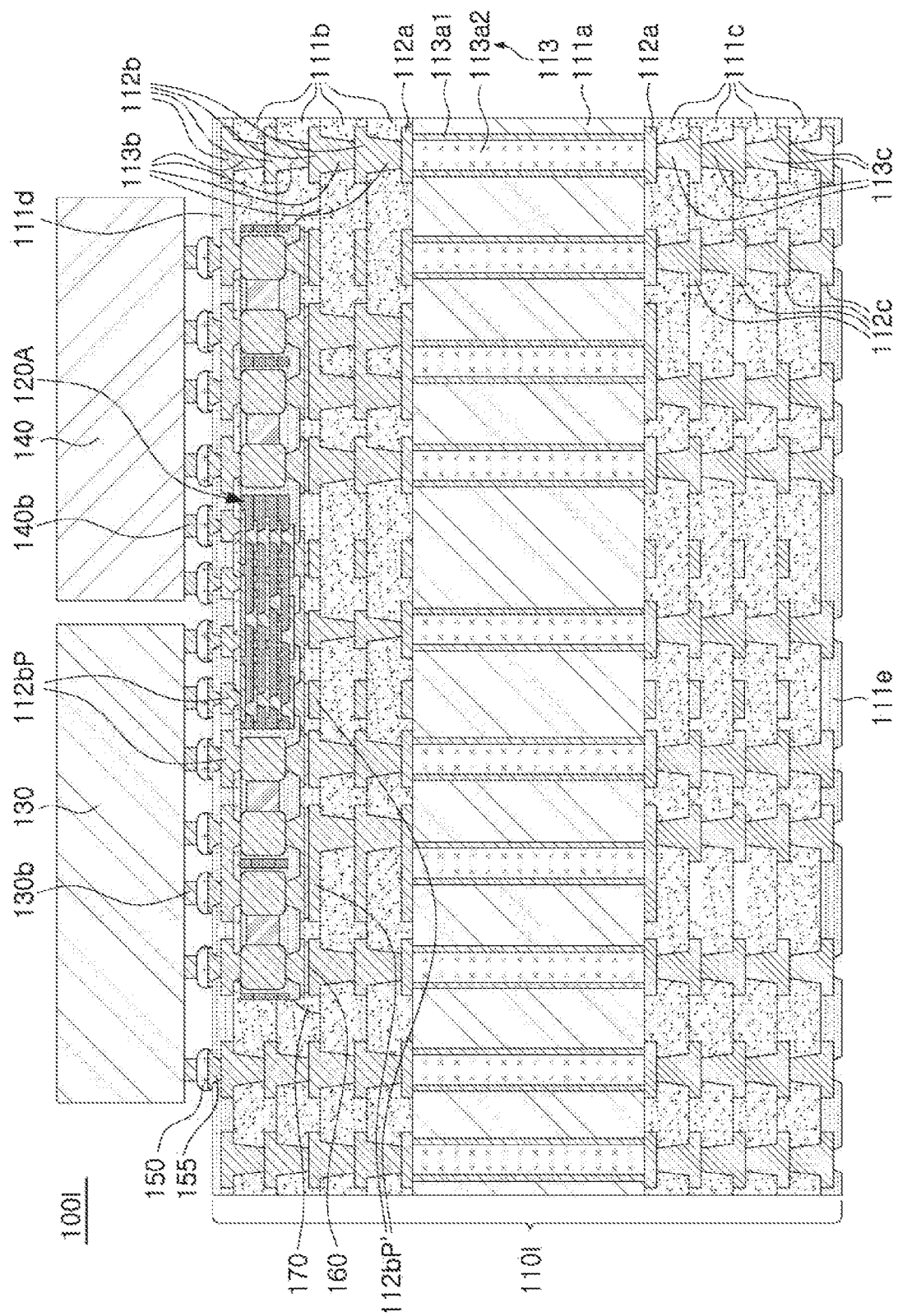
FIG. 14 is a schematic cross-sectional diagram illustrating another example of a substrate having an embedded interconnect structure.

FIG. 14 is a schematic cross-sectional diagram illustrating another example of a substrate having an embedded interconnect structure.

Figure 15:
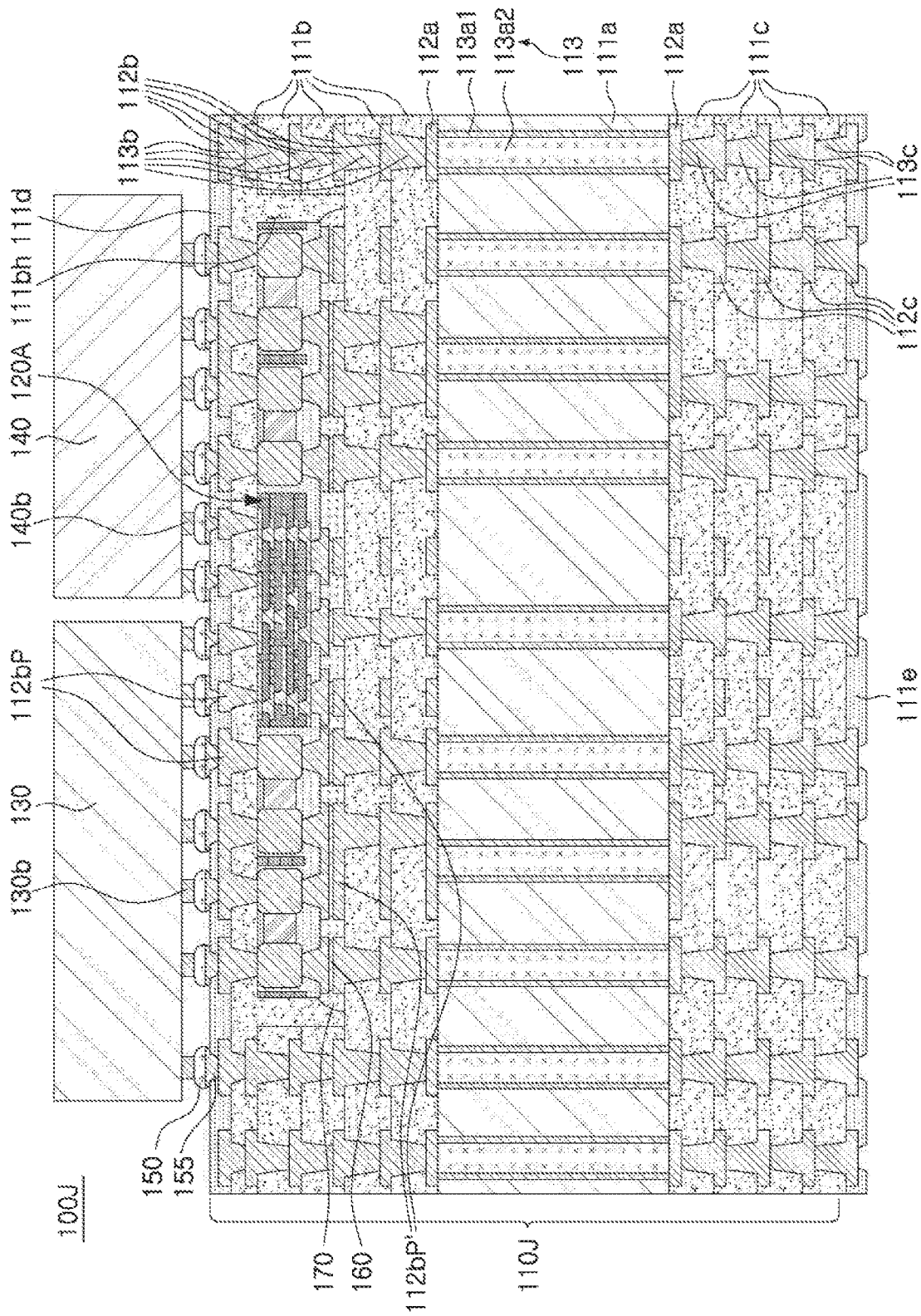
FIG. 15 is a schematic cross-sectional diagram illustrating another example of a substrate having an embedded interconnect structure.

FIG. 15 is a schematic cross-sectional diagram illustrating another example of a substrate having an embedded interconnect structure.

Figure 16:
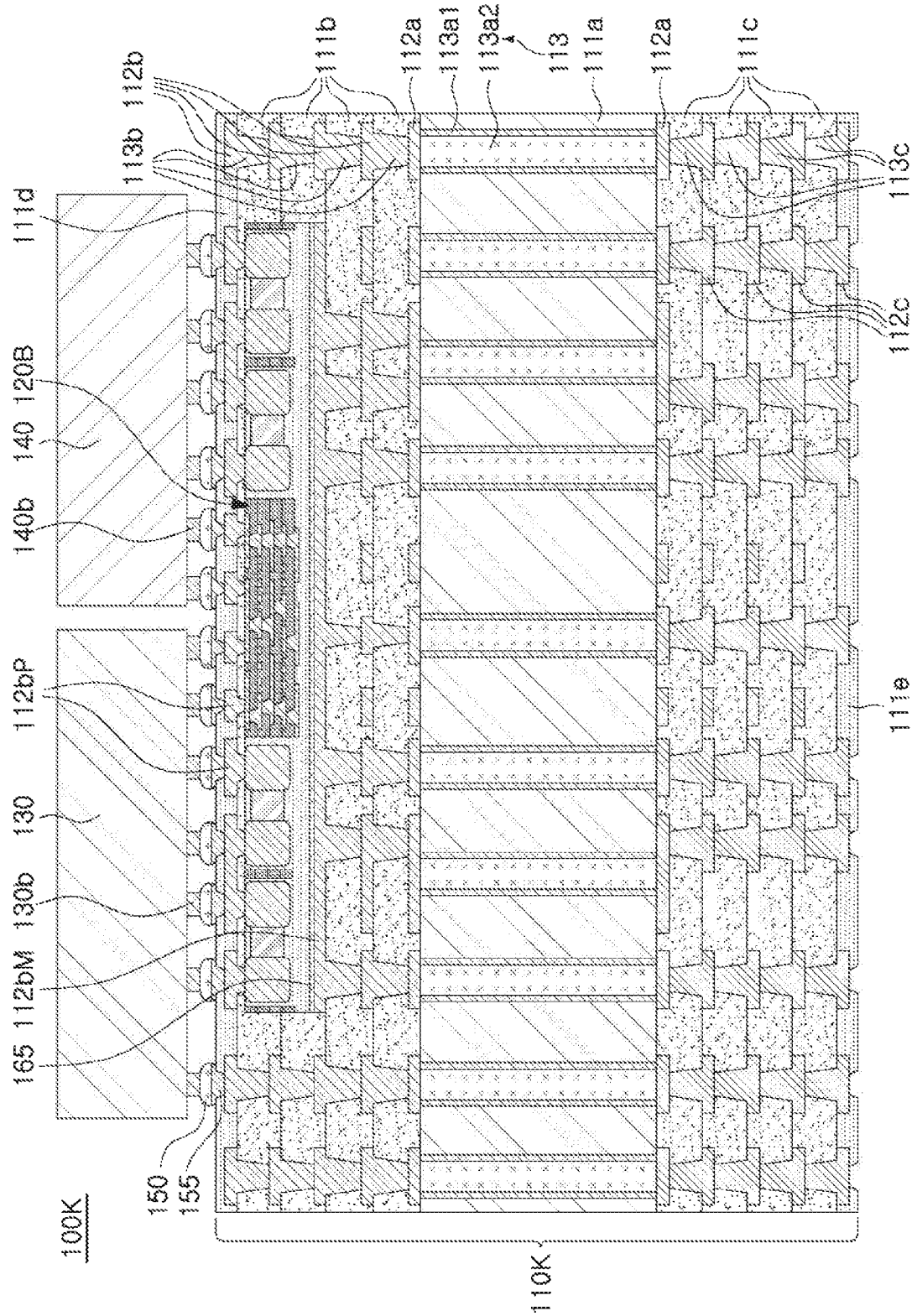
FIG. 16 is a schematic cross-sectional diagram illustrating another example of a substrate having an embedded interconnect structure.

FIG. 16 is a schematic cross-sectional diagram illustrating another example of a substrate having an embedded interconnect structure.

Figure 17:
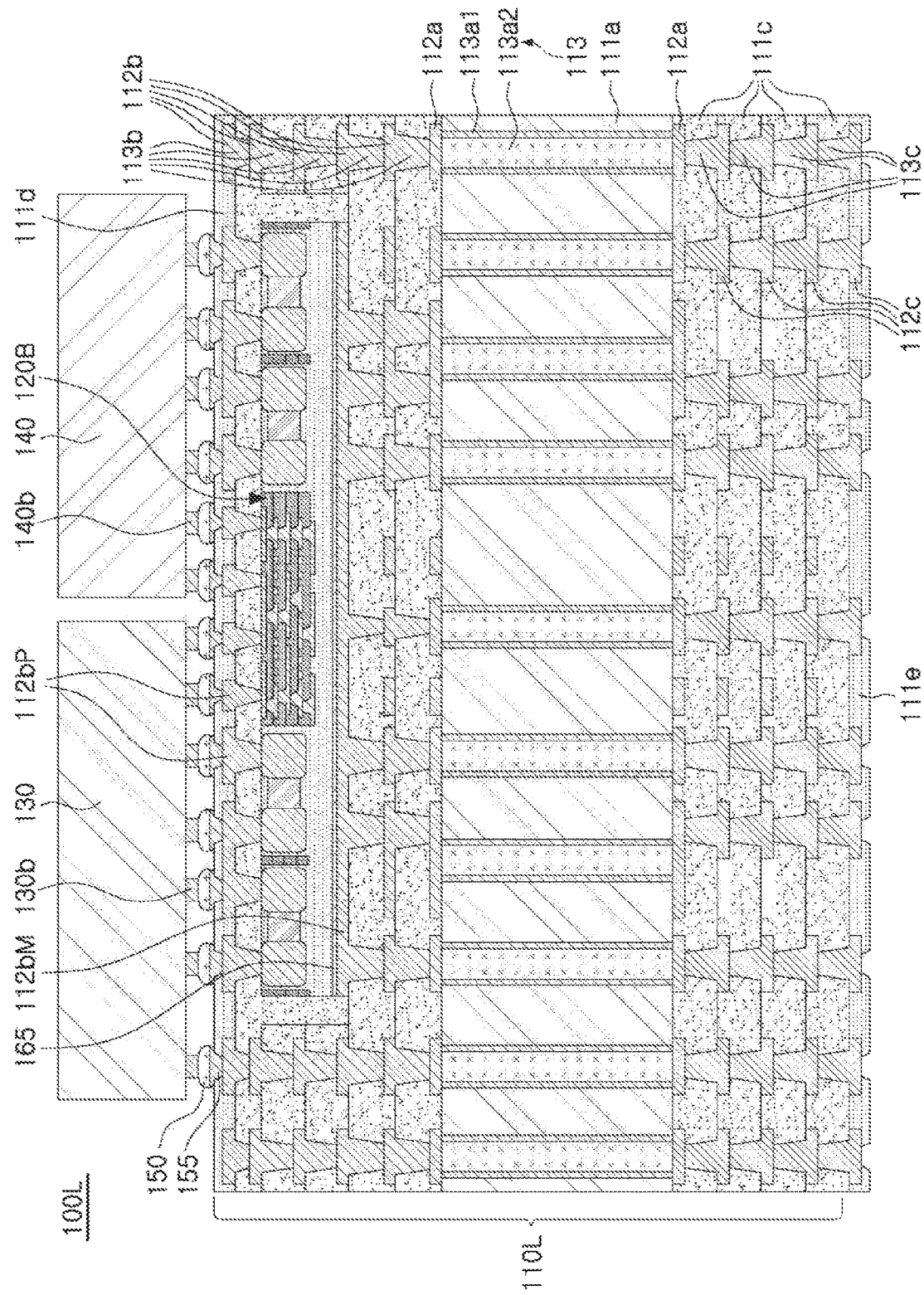
FIG. 17 is a schematic cross-sectional diagram illustrating another example of a substrate having an embedded interconnect structure.

FIG. 17 is a schematic cross-sectional diagram illustrating another example of a substrate having an embedded interconnect structure.

Referring to the diagrams, in substrates having an embedded interconnect structure 100I, 100J, 100K and 100L, printed circuit boards 110I, 110J, 110K and 110L may be disposed instead of printed circuit boards 110A, 110C, 110E and 110G, as compared to the substrates having an embedded interconnect structure 100A, 100C, 100E and 100G. The printed circuit boards 110I, 110J, 110K and 110L may include a core insulating layer 111a having a greater thickness, a greater number of build-up insulating layers 111b and 111c, a greater number of wiring layers 112b and 112c, and a greater number of wiring via layers 113b and 113c. A thickness of the core insulating layer 111a may be greater than an overall thickness of a first build-up insulating layer 111b and/or an overall thickness of a second build-up insulating layer 111c. As a thickness of the core insulating layer 111a is relatively great, a first via layer 113a may be a plated through-hole (PHT) in which a conductive material 113a1 is plated and formed along a wall of the perpendicular through-hole having a cylindrical shape in a conformal manner. In this case, a space of the through-hole between conductive materials may be filled with a plugging material 113a2. The plugging material 113a2 may be a well-known plugging material such as an insulating material or a conductive ink. Meanwhile, in the printed circuit boards 110I, 110J, 110K and 110L, interconnect structures 120A and 120B may be disposed on the first build-up insulating layer 111b, rather than on the core insulating layer 111a. In other words, one of second wiring layers 112b may include a pad 112bP' for mounting the interconnect structure 120A, or a metal layer 112bM may be disposed one of the first build-up insulating layers 111b. Meanwhile, in the printed circuit boards 110I, 110J, 110K and 110L, a first electrical connection metal 150 may be connected to the first pad 112bP described above by means of an underbump metal 155. In other words, a plurality of the underbump metals 155 may be formed in a plurality of openings, respectively, which allow a plurality of the first pads 112bP on an outermost insulating layer among the first build-up insulating layers 111b to be exposed, and the first electrical connection metals 150 may be connected to the underbump metals 155, respectively. By the configuration above, excellent reliability may be secured. The descriptions of the other components and configurations will not be repeated as the descriptions are the same as the descriptions described with reference to FIGS. 6 to 13 and other diagrams.

Figure 18:
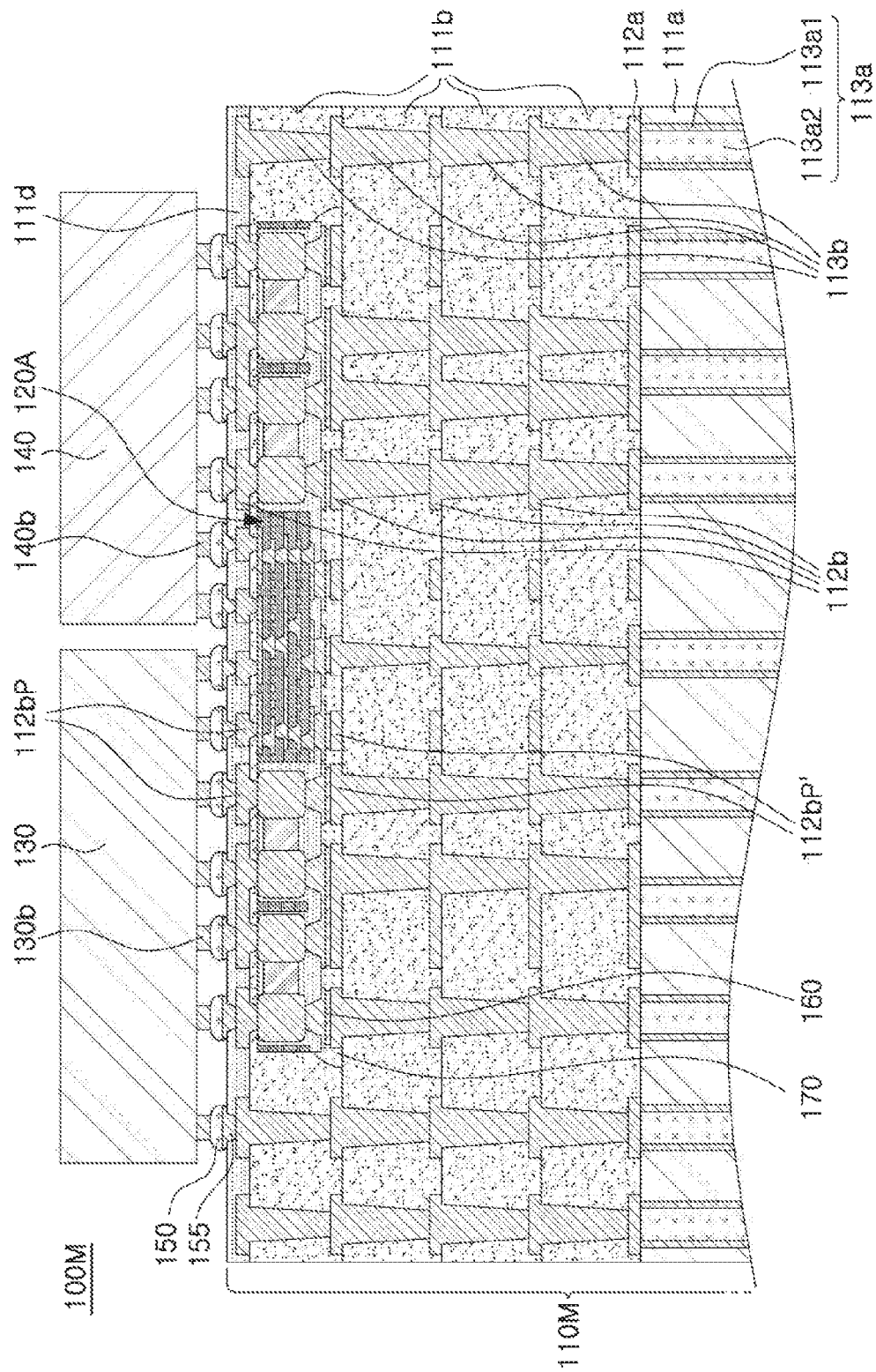
FIG. 18 is a schematic cross-sectional diagram illustrating another example of a substrate having an embedded interconnect structure.
Figure 19:
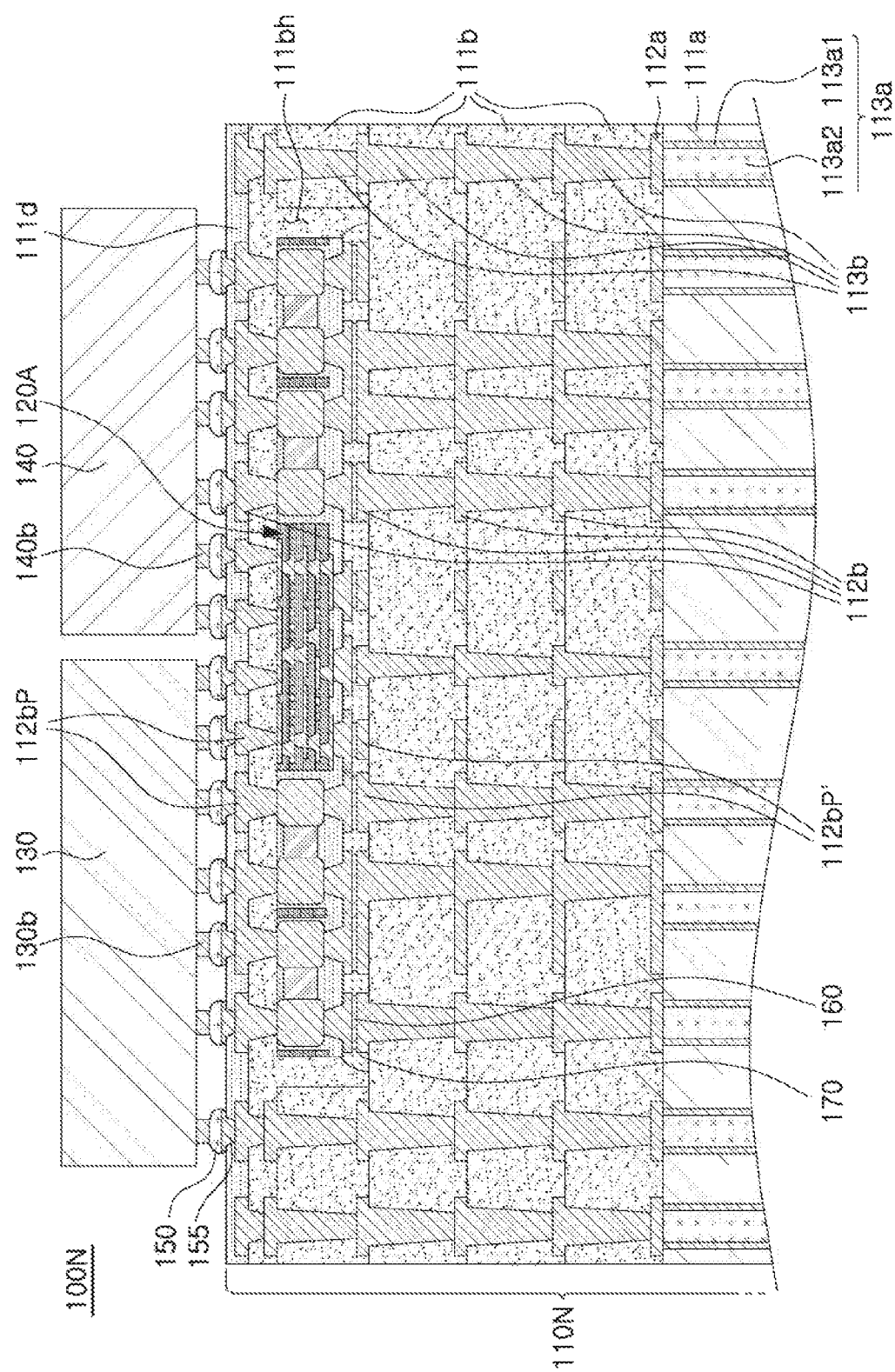
FIG. 19 is a schematic cross-sectional diagram illustrating another example of a substrate having an embedded interconnect structure.

FIG. 18 is a schematic cross-sectional diagram illustrating another example of a substrate having an embedded interconnect structure;

FIG. 19 is a schematic cross-sectional diagram illustrating another example of a substrate having an embedded interconnect structure.

Figure 20:
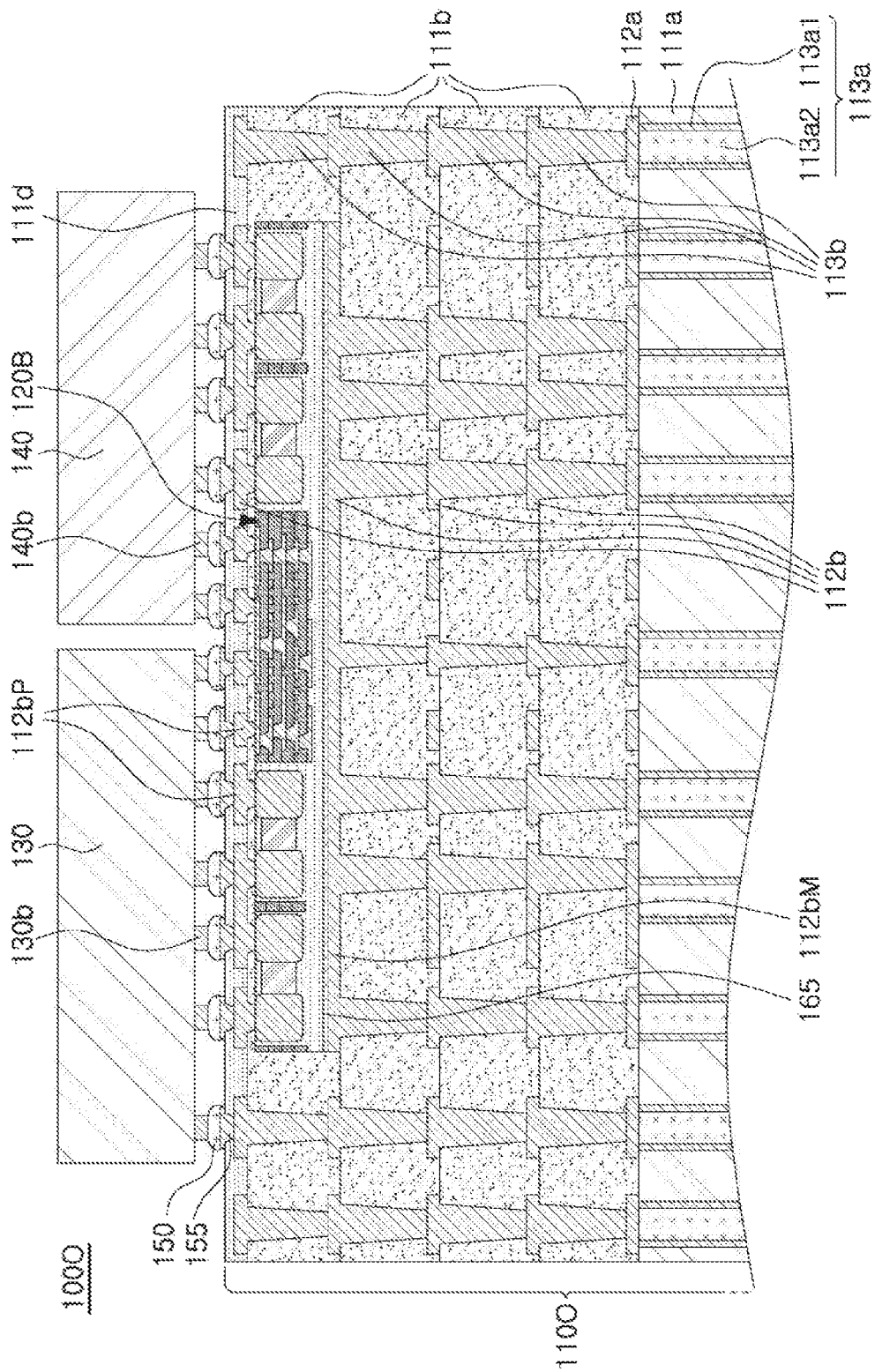
FIG. 20 is a schematic cross-sectional diagram illustrating another example of a substrate having an embedded interconnect structure.

FIG. 20 is a schematic cross-sectional diagram illustrating another example of a substrate having an embedded interconnect structure.

Figure 21:
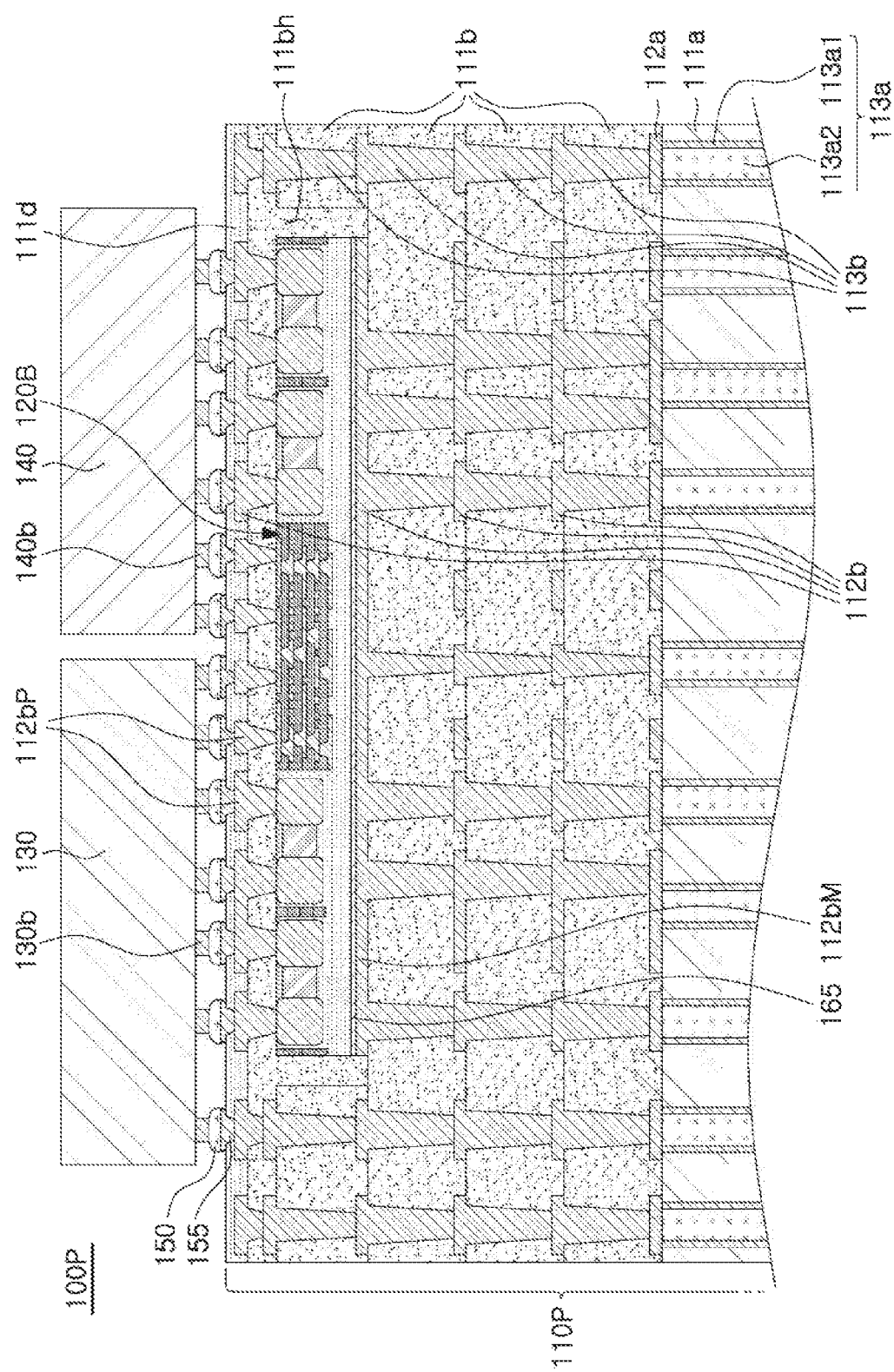
FIG. 21 is a schematic cross-sectional diagram illustrating another example of a substrate having an embedded interconnect structure.

FIG. 21 is a schematic cross-sectional diagram illustrating another example of a substrate having an embedded interconnect structure.

Referring to the diagrams, in substrates having an embedded interconnect structure 100M, 100N, 100O and 100P, printed circuit boards 110M, 110N, 110O and 110P may be disposed instead of printed circuit boards 110I, 110J, 110K and 110L, as compared to the substrates having an embedded interconnect structure 100I, 100J, 100K and 100L. In each of the printed circuit boards 110M, 110N, 110O and 110P, interconnect structures 120A and 120B may be embedded in a first build-up insulating layer 111b, configured as one layer, rather than in a plurality of first build-up insulating layers 111b, or a cavity 112bh in which the interconnect structures 120A and 120B are disposed may penetrate through a first build-up insulating layer 111b, configured as one layer, rather than penetrating through a plurality of first build-up insulating layers 111b. The descriptions of the other components and configurations will not be repeated as the descriptions are the same as the descriptions described with reference to FIGS. 6 to 17 and other diagrams.

Figure 22A:
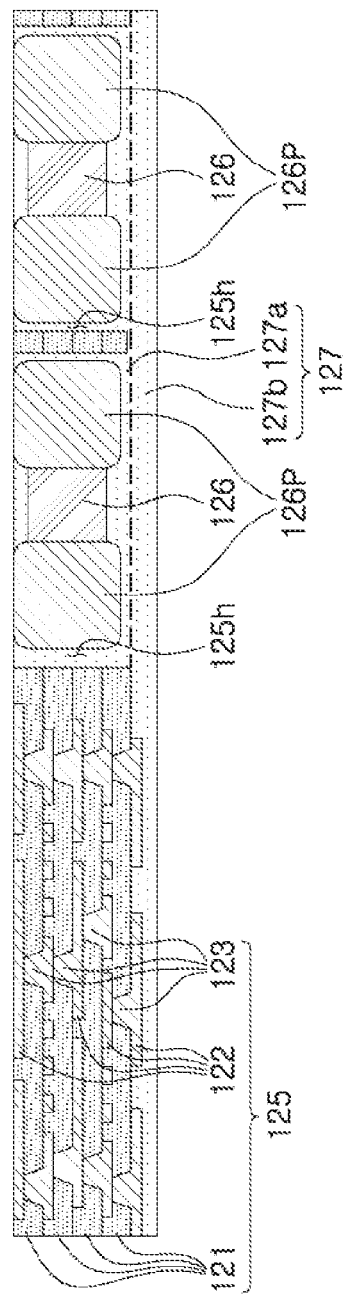
FIGS. 22A and 22B are schematic cross-sectional diagrams illustrating other examples of an interconnect structure applicable to a substrate having an embedded interconnect structure.
Figure 22B:
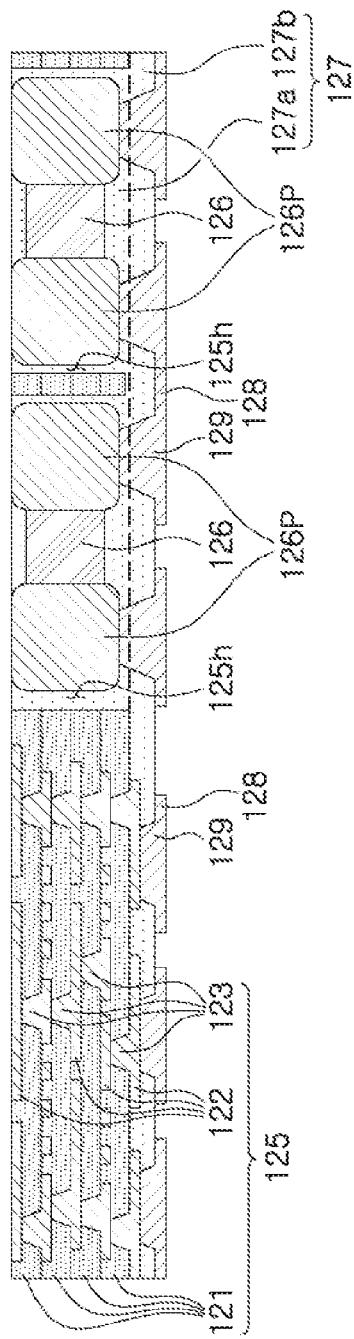

FIGS. 22A and 22B are schematic cross-sectional diagrams illustrating other examples of an interconnect structure applicable to a substrate having an embedded interconnect structure.

Referring to the diagrams, a reinforcing layer 127 may be configured to be a plurality of reinforcing layers 127a and 127b. For example, the reinforcing layer 127 may include a first reinforcing layer 127a filling at least a portion of each of cavities 125h and covering at least a portion of each of passive devices 126, and a second reinforcing layer 127b covering at least a portion of a circuit member 125 and at least a portion of the first reinforcing layer 127a. The first and second reinforcing layers 127a and 127b may include different materials, and thus, a boundary between the first and second reinforcing layers 127a and 127b may be distinct. A stiffness of the second reinforcing layer 127b may be greater than a stiffness of the first reinforcing layer 127a. In other words, the second reinforcing layer 127b may have an elastic modulus greater than an elastic modulus of the first reinforcing layer 127a. As an example, a material of the first reinforcing layer 127a may be an ABF, a PID, or the like, and a material of the second reinforcing layer 127b may be a pregreg or an inorganic material, but the materials are not limited thereto. If necessary, a portion of the second reinforcing layer 127b may be a metal to enhance stiffness, and in this case, it may be desirable to appropriately dispose an insulating material to implement electrical insulation with a circuit layer 122 or an external electrode 126P.

According to the aforementioned exemplary embodiments, a substrate having an embedded interconnect structure including a circuit capable of electrically connecting electronic components mounted on a printed circuit board, and which may resolve a reliability issue, reduce costs, and improve power integrity properties may be provided.

In the exemplary embodiments, the terms "lower side," "lower portions," "bottom surface," and the like, may be used to refer to directions facing a mounting surface of a semiconductor package including an organic interposer with reference to a cross-section in the diagrams, and the terms "upper side," "upper portion," "top surfaces," and the like, may be used to refer to directions opposite to the above directions. The terms may be defined as above for ease of description, and the scope of right of the exemplary embodiments is not particularly limited to the above terms.

In the exemplary embodiments, the term. "connected" may not only refer to "directly connected" but also include "indirectly connected" by means of an adhesive layer, or the like. Also, the term. "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of right of the exemplary embodiments.

In the exemplary embodiments, the term "exemplary embodiment" may not refer to one same exemplary embodiment, but may be provided to describe and emphasize different unique features of each exemplary embodiment. The above suggested exemplary embodiments may be implemented do not exclude the possibilities of combination with features of other exemplary embodiments. For example, even though the features described in one exemplary embodiment are not described in the other exemplary embodiment, the description may be understood as relevant to the other exemplary embodiment unless otherwise indicated.

The terms used in the exemplary embodiments are used to simply describe an exemplary embodiment, and are not intended to limit the present disclosure. A singular term includes a plural form unless otherwise indicated.

While the exemplary embodiments have been shown and described above, it will be apparent to those skilled in the art that modifications and variations could be made without departing from the scope of the present invention as defined by the appended claims.

What is claimed is:

1. A substrate having an embedded interconnect structure, comprising:
   an interconnect structure comprising a circuit member including a plurality of circuit layers, and a passive device disposed in parallel with the circuit member and including external electrodes; and
   a printed circuit board comprising an insulating layer covering the interconnect structure, a first wiring layer disposed on the insulating layer, a first wiring via penetrating through at least a portion of the insulating layer and connecting the first wiring layer to an uppermost circuit layer, among the plurality of circuit layers, and a second wiring via penetrating through at least a portion of the insulating layer and connecting the first wiring layer to one of the external electrodes of the passive device,
   wherein a top surface of the uppermost circuit layer, contacting the first wiring via, is coplanar with a top surface of the one of external electrodes, contacting the second wiring via,
   the interconnect structure further comprises a reinforcing layer, the reinforcing layer including a first region covering at least a portion of the circuit member and at least a portion of the passive device between the external electrodes,
   the circuit member has a cavity in which the passive device is disposed,
   the reinforcing layer includes a second region disposed in at least a portion of the cavity,
   the first region and the second region of the reinforcing layer are integrated with each other without a boundary therebetween, and
   the printed circuit board covers an upper surface and a lower surface of the interconnect structure opposing each other, and covers side surfaces of the interconnect structure opposing each other.

2. The substrate having an embedded interconnect structure of claim 1, wherein the interconnect structure further comprises a backside circuit layer disposed on a bottom surface of the reinforcing layer, and a backside connection via layer penetrating through at least a portion of the reinforcing layer and connecting the backside circuit layer to a lowermost circuit layer, among the plurality of circuit layers and the one of the external electrodes of the passive device.

3. The substrate having an embedded interconnect structure of claim 2, wherein the interconnect structure in the printed circuit board has a plurality of pads disposed in a lower portion thereof, the interconnect structure is disposed on the plurality of pads, and the backside circuit layer is connected to the plurality of pads by an electrical connection metal.

4. The substrate having an embedded interconnect structure of claim 1, wherein the interconnect structure in the printed circuit board has a metal layer disposed in a lower portion of the interconnect structure, the interconnect structure is disposed on the metal layer, and a bottom surface of the reinforcing layer is attached to the metal layer by an adhesive.

5. The substrate having an embedded interconnect structure of claim 1, wherein the interconnect structure further comprises a plurality of insulating layers on which the plurality of circuit layers are disposed, respectively, and a plurality of connection via layers penetrating through the plurality of insulating layers and connecting the plurality of circuit layers to each other, and a top surface of the uppermost insulating layer among the plurality of insulating layers is coplanar with a top surface of the uppermost circuit layer and a top surface of the one of the external electrodes.

6. The substrate having an embedded interconnect structure of claim 5, wherein each of the plurality of insulating layers comprises a photoimageable dielectric.

7. The substrate having an embedded interconnect structure of claim 1, wherein the reinforcing layer has an elastic modulus greater than an elastic modulus of each of the plurality of insulating layers.

8. The substrate having an embedded interconnect structure of claim 5, wherein each of the plurality of circuit layers has a density higher than a density of the first wiring layer.

9. The substrate having an embedded interconnect structure of claim 8, wherein each of the plurality of connection via layers has connection vias having a height lower than a height of the first and second wiring vias, and a pitch between the connection vias is lower than those between the first and second wiring vias.

10. The substrate having an embedded interconnect structure of claim 1, wherein the printed circuit board further comprises a second wiring layer disposed in a lower portion of the first wiring layer and having at least a portion covered by the insulating layer, and a third wiring vias penetrating through at least a portion of the insulating layer and connecting the first and second wiring layers,
    wherein the first and second wiring vias have heights different from a height of the third wiring via.

11. The substrate having an embedded interconnect structure of claim 1, wherein the printed circuit substrate comprises:
    a core insulating layer;
    core wiring layers disposed on both surfaces of the core insulating layer;
    a core wiring via layer penetrating through the core insulating layer and connecting the core wiring layers disposed on different layers to each other;
    a plurality of first build-up insulating layers built up upwardly of the core insulating layer;
    a plurality of first build-up wiring layers disposed on the plurality of first build-up insulating layers, respectively;
    a plurality of first build-up wiring vias layers penetrating through the plurality of first build-up insulating layers, respectively, and connecting the core wiring layers disposed on different layers to the plurality of first built-up wiring layers;
    a plurality of second build-up insulating layers built up downwardly of the core insulating layer;

a plurality of second build-up wiring layers disposed on the plurality of second build-up insulating layers, respectively; and a plurality of second build-up wiring via layers penetrating through the plurality of second build-up insulating layers, respectively, and connecting the core wiring layers disposed on different layers to the plurality of second build-up wiring layers, the plurality of first build-up insulating layers comprise the insulating layer, the plurality of first build-up wiring layers comprise the first wiring layer, and the plurality of first build-up wiring vias layers comprise the first and second wiring vias, the core insulating layer has a thickness greater than a thickness of each of the plurality of first build-up wiring layers or a thickness of each of the plurality of second build-up wiring layers.

12. The substrate having an embedded interconnect structure of claim 11, wherein the core wiring layer comprises a conductive material disposed on a wall of a through-hole penetrating through the core insulating layer, and a plugging material disposed in a space between the conductive materials of the through-hole.

13. The substrate having an embedded interconnect structure of claim 11, wherein the core wiring layer comprises a conductive material completely disposed in a through-hole penetrating through the core insulating layer.

14. A substrate having an interconnect structure, comprising:

an interconnect structure, as an integral component, comprising a circuit member including a circuit layer and a passive device disposed in parallel with the circuit member and having an external electrode;

a printed circuit substrate comprising a wiring layer connected to the circuit layer and having a density lower than a density of the circuit layer; and a plurality of electronic components mounted on the printed circuit substrate in parallel to each other, and connected to the wiring layer by an electrical connection metal, wherein the plurality of electronic components are connected to each other by the circuit layer, the interconnect structure includes a first insulating layer on which the circuit layer is disposed, the first insulating layer includes an organic material, the printed circuit substrate includes a same cavity in which the interconnect structure is disposed, and the printed circuit substrate covers an upper surface and a lower surface of the interconnect structure opposing each other, and covers side surfaces of the interconnect structure opposing each other.

15. The substrate having an embedded interconnect structure of claim 14, wherein at least one of the plurality of electronic components is disposed orthogonally on the passive device, and connected to the external electrode of the passive device by the wiring layer.

16. The substrate having an embedded interconnect structure of claim 14, wherein the printed circuit substrate further comprises an insulating layer covering the interconnect structure, the wiring layer is disposed on the insulating layer, and the wiring layer is connected to the circuit layer of the circuit member and the external electrode of the passive device by a wiring via layer penetrating through at least a portion of the insulating layer.

17. The substrate having an embedded interconnect structure of claim 16, wherein the printed circuit board further comprises an outermost insulating layer disposed on the insulating layer and having a plurality of openings allowing at least a portion of the wiring layer to be exposed, and a plurality of under bump metals disposed on the plurality of openings of the outermost insulating layer, respectively, and connected to the exposed wiring layer, and the electrical connection metal is connected to the plurality of under bump metals.

18. A substrate, comprising:

an interconnect substrate comprising circuit layers spaced apart from each other in a thickness direction of the substrate by first insulating layers therebetween, and connected to each other by first connection via layers respectively passing through the first insulating layers;

a printed circuit substrate comprising wiring layers stacked on each other, spaced apart from each other in the thickness direction of the substrate by second insulating layers therebetween, and connected to each other by second connection via layers respectively passing through the second insulating layers; and electronic components disposed on the printed circuit substrate, respectively overlapping portions of the interconnect substrate in the thickness direction, and connected to each other at least through the circuit layers of the interconnection structure, wherein one of the wiring layers of the printed circuit substrate extends over the interconnect substrate and is disposed between the electronic components and the interconnect substrate, a via of a via layer among the second connection via layers connected to the one of the wiring layers disposed between the electronic components and the interconnect substrate has a width decreasing in a direction from one of the electronic components to the interconnect substrate, a via of the first connection via layers of the interconnect substrate has a width increasing in the direction from the one of the electronic components to the interconnect structure, each of the first insulating layers of the interconnect substrate includes an organic material, and the printed circuit substrate covers an upper surface and a lower surface of the interconnect structure opposing each other, and covers side surfaces of the interconnect substrate opposing each other.

19. The substrate of claim 18, wherein the interconnect substrate further comprises a passive component embedded in the interconnect substrate, and an external electrode of the passive component is connected to the one of the wiring layers disposed between the electronic components and the interconnect substrate, directly through a via in the via layer among the second connection via layers connected to the one of the wiring layers disposed between the electronic components and the interconnect substrate.

20. The substrate of claim 18, wherein the interconnect substrate has the side surfaces being in contact with two or more of the second insulating layers of the printed circuit substrate.

21. The substrate of claim 18, wherein the interconnect substrate has the side surfaces being in contact with only one of the second insulating layers of the printed circuit substrate.

22. The substrate of claim 18, wherein on a level between upper and lower surfaces of the interconnect substrate, the number of the first insulating layers of the interconnect substrate is greater than the number of the second insulating layers of the printed circuit substrate.

23. A substrate, comprising:
an interconnect structure, as an integral component, comprising circuit layers spaced apart from each other in a thickness direction of the substrate by first insulating layers therebetween and connected to each other by first connection via layers respectively passing through the first insulating layers, a passive component disposed in a cavity of the first insulating layers, and a reinforcing layer covering the passive component and one of the circuit layers and filling at least a portion of the cavity;
a printed circuit substrate comprising wiring layers stacked on each other, spaced apart from each other in the thickness direction of the substrate by second insulating layers therebetween, and connected to each other by second connection via layers respectively passing through the second insulating layers; and
electronic components disposed on the printed circuit substrate, respectively overlapping portions of the interconnect structure in the thickness direction, and connected to each other at least through the circuit layers of the interconnection structure,
wherein one of the wiring layers extends over the interconnect structure and is disposed between the electronic components and the interconnect structure,
the one of the circuit layers covered by a portion of the reinforcing layer is disposed between the portion of the reinforcing layer and the one of the wiring layers disposed between the electronic components and the interconnect structure, and
each of the first insulating layers of the interconnect structure includes an organic material,
the printed circuit substrate includes a same cavity in which the interconnect structure is disposed, and
the printed circuit substrate covers an upper surface and a lower surface of the interconnect structure opposing each other, and covers side surfaces of the interconnect structure opposing each other.

24. The substrate of claim 23, wherein an external electrode of the passive component is connected to the one of the wiring layers disposed between the electronic components and the interconnect structure, directly through a via in the via layer among the second connection via layers connecting the one of the wiring layers disposed between the electronic components and the interconnect structure.

25. The substrate of claim 23, wherein the interconnect structure has the side surfaces being in contact with two or more of the second insulating layers of the printed circuit substrate.

26. The substrate of claim 23, wherein the interconnect structure has the side surfaces being in contact with only one of the second insulating layers of the printed circuit substrate.

27. The substrate of claim 23, wherein on a level between upper and lower surfaces of the interconnect structure, the number of the first insulating layers of the interconnect structure is greater than the number of the second insulating layers of the printed circuit substrate.

28. The substrate of claim 23, wherein the electronic components respectively overlap portions of the circuit layers of the interconnect structure in the thickness direction.

29. The substrate of claim 18, wherein the electronic components respectively overlap portions of the circuit layers of the interconnect substrate in the thickness direction.

30. The substrate having an embedded interconnect structure of claim 14, wherein the plurality of electronic components respectively overlap portions of the circuit layer of the interconnect substrate in a thickness direction in which the plurality of electronic components are mounted on the printed circuit substrate.

31. The substrate having an embedded interconnect structure of claim 1, wherein each of the first wiring via and the second wiring via has a width decreasing in a direction from the first wiring layer to the interconnect structure, and
a via in the interconnect substrate has a width increasing in the direction from the first wiring layer to the interconnect structure.

* * * * *